United States Patent
Forbes et al.

(10) Patent No.: US 6,448,601 B1
(45) Date of Patent: Sep. 10, 2002

(54) MEMORY ADDRESS AND DECODE CIRCUITS WITH ULTRA THIN BODY TRANSISTORS

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/780,144

(22) Filed: Feb. 9, 2001

(51) Int. Cl.$^7$ ............................................. H01L 27/108
(52) U.S. Cl. .......................................... 257/302; 257/51
(58) Field of Search ...................... 365/230.02, 230.06, 365/230.05; 438/257; 257/302, 202, 330, 320, 328, 365, 329, 331, 297, 51

(56) References Cited

U.S. PATENT DOCUMENTS

| | | | | |
|---|---|---|---|---|
| 4,896,293 A | * | 1/1990 | McElroy | 257/297 |
| 4,926,224 A | * | 5/1990 | Redwine | 257/302 |
| 5,691,230 A | | 11/1997 | Forbes | 437/62 |
| 5,991,225 A | * | 11/1999 | Forbes et al. | 365/230.06 |
| 6,072,209 A | | 6/2000 | Noble et al. | 257/296 |
| 6,134,175 A | * | 10/2000 | Forbes et al. | 365/230.06 |
| 6,150,687 A | | 11/2000 | Noble et al. | 257/302 |
| 6,153,468 A | * | 11/2000 | Forbes et al. | 438/257 |
| 6,174,784 B1 | | 1/2001 | Forbes | 438/405 |
| 6,208,164 B1 | * | 3/2001 | Forbes et al. | 326/41 |

OTHER PUBLICATIONS

Hergenrother, J.M., "Ther Vertical Replacement–Gate (VRG) MOSFET: A 50nm Vertical MOSFET with Lithography–Independent Gate Length", *IEEE*, pp. 75–78, (1999).

Kalavade, P., et al., "A Novel sub–10nm Transistor", *IEEE Device Research Conference*, Denver, Co., pp. 71–72, (2000).

Xuan, P., et al., "60nm Planarized Ultra–thin Body Solid Phase Epitaxy MOSFETs", *IEEE Device Research Conference*, Denver, CO, pp. 67–68, (2000).

* cited by examiner

Primary Examiner—David Nelms
Assistant Examiner—Long K. Tran
(74) Attorney, Agent, or Firm—Schwegman, Lundberg, Woessner & Kluth, P. A.

(57) ABSTRACT

A decoder for a memory device is provided. The decoder array includes a number of address lines and a number of output lines. The address lines and the output lines form an array. The decoder includes a number of vertical pillars extending outwardly from a semiconductor substrate at intersections of output lines and address lines. Each pillar includes a single crystalline first contact layer and a second contact layer separated by an oxide layer. The decoder further includes a number of single crystalline ultra thin vertical transistor that are selectively disposed adjacent the number of vertical pillars. Each single crystalline vertical transistor includes an ultra thin single crystalline vertical first source/drain region coupled to the first contact layer, an ultra thin single crystalline vertical second source/drain region coupled to the second contact layer, and an ultra thin single crystalline vertical body region which opposes the oxide layer and couples the first and the second source/drain regions. A plurality of buried source lines formed of single crystalline semiconductor material are disposed below the pillars in the array for interconnecting with the first contact layer of pillars in the array. And, each of the number of address lines is disposed in a trench between rows of the pillars for addressing the ultra thin single crystalline vertical body regions of the single crystalline vertical transistors that are adjacent to the trench.

52 Claims, 19 Drawing Sheets

$V_G \longrightarrow V_G/k$     $V_0 \longrightarrow V_0/k$ $t_{ox} \longrightarrow t_{ox}/k$ $L \longrightarrow L/k$ $X_j \longrightarrow X_j/k$     JUNCTION DEPTH DECREASED $W_d \longrightarrow W_d/k$ $N_A \longrightarrow k N_A$     SUBSTRATE DOPING INCREASED

MEMORY ADDRESS AND DECODE CIRCUITS WITH ULTRA THIN BODY TRANSISTORS

CROSS REFERENCE TO RELATED APPLICATIONS

This application is related to the following co-pending, commonly assigned U.S. patent applications: "Open Bit Line DRAM with Ultra Thin Body Transistors," Ser. No. 09/781,125, "Folded Bit Line DRAM with Ultra Thin Body Transistors," Ser. No. 09/780,130, "Programmable Logic Arrays with Ultra Thin Body Transistors," Ser. No. 09/780,087, "Programmable Memory Address and Decode Circuits with Ultra Thin Transistors," Ser. No. 09/780,126, "In Service Programmable Logic Arrays with Ultra Thin Body Transistors," Ser. No. 09/780,129, and "Flash Memory with Ultra Thin Vertical Body Transistors," Ser. No. 09/780,169, which are filed on even date herewith and each of which disclosure is herein incorporated by reference.

TECHNICAL FIELD OF THE INVENTION

This invention relates generally to integrated circuits and in particular to a memory address and decode circuits with ultra thin body transistors.

BACKGROUND OF THE INVENTION

Modern electronic systems typically include a data storage device such as a dynamic random access memory (DRAM), static random access memory (SRAM), video random access memory (VRAM), erasable programmable read only memory (EPROM), flash memory, or other conventional memory device. As these systems become more sophisticated, they require more and more memory in order to keep pace with the increasing complexity of software based applications that run on the systems. Thus, as the technology relating to memory devices has evolved, designers have tried to increase the density of the components of the memory device. For example, the electronics industry strives to decrease the size of memory cells that store the data in the memory device. This allows a larger number of memory cells to be fabricated without substantially increasing the size of the semiconductor wafer used to fabricate the memory device.

Memory devices store data in vast arrays of memory cells. Essentially, the cells are located at intersections of wordlines and bitlines (rows and columns of an array). Each cell conventionally stores a single bit of data as a logical "1" or a logical "0" and can be individually accessed or addressed. Conventionally, each cell is addressed using two multi-bit numbers. The first multi-bit number, or row address, identifies the row of the memory array in which the memory cell is located. The second multi-bit number, or column address, identifies the column of the memory array in which the desired memory cell is located. Each row address/column address combination corresponds to a single memory cell.

To access an individual memory cell, the row and column addresses are applied to inputs of row and column decoders, respectively. Conventionally, row and column decoders are fabricated using programmable logic arrays. These arrays are configured so as to select desired word and bit lines based on address signals applied to the inputs of the array. As with the array of memory cells, the decoder arrays use a portion of the surface area of the semiconductor wafer. Thus, designers also strive to reduce the surface area required for the decoder arrays.

Memory devices are fabricated using photolithographic techniques that allow semiconductor and other materials to be manipulated to form integrated circuits as is known in the art. These photolithographic techniques essentially use light that is focused through lenses and masks to define patterns in the materials with microscopic dimensions. The equipment and techniques that are used to implement this photolithography provide a limit for the size of the circuits that can be formed with the materials. Essentially, at some point, the lithography cannot create a fine enough image with sufficient clarity to decrease the size of the elements of the circuit. In other words, there is a minimum dimension that can be achieved through conventional photolithography. This minimum dimension is referred to as the "critical dimension" (CD) or minimum "feature size" (F) of the photolithographic process. The minimum feature size imposes one constraint on the size of the components of a memory device, including the decoder array. In order to keep up with the demands for higher capacity memory devices, designers search for other ways to reduce the size of the components of the memory device, including the decoder array.

As the density requirements become higher and higher in gigabit DRAMs and beyond, it becomes more and more crucial to minimize device area. The NOR address decode circuit is one example of an architecture for row and column decoders.

The continuous scaling, however, of MOSFET technology to the deep sub-micron region where channel lengths are less than 0.1 micron, 100 $\mu$m, or 1000 A causes significant problems in the conventional transistor structures. As shown in FIG. 1, junction depths should be much less than the channel length of 1000 A, or this implies junction depths of a few hundred Angstroms. Such shallow junctions are difficult to form by conventional implantation and diffusion techniques. Extremely high levels of channel doping are required to suppress short-channel effects such as drain-induced barrier lowering; threshold voltage roll off, and sub-threshold conduction. Sub-threshold conduction is particularly problematic in DRAM technology as it reduces the charge storage retention time on the capacitor cells. These extremely high doping levels result in increased leakage and reduced carrier mobility. Thus making the channel shorter to improve performance is negated by lower carrier mobility.

For the reasons stated above, and for other reasons stated below which will become apparent to those skilled in the art upon reading and understanding the present specification, there is a need in the art for memory address and decode circuits that use less surface area of a semiconductor wafer as compared to conventional decoder arrays.

SUMMARY OF THE INVENTION

The above mentioned problems with decoder arrays and other problems are addressed by the present invention and will be understood by reading and studying the following specification. A circuit and method for a decoder array using ultra thin body vertical transistors is provided.

In particular, one embodiment of the present invention provides a decoder for a memory device. The decoder includes a number of address lines and a number of output lines. The address lines and the output lines form an array. The decoder includes a number of vertical pillars extending outwardly from a semiconductor substrate at intersections of output lines and address lines. Each pillar includes a single crystalline first contact layer and a second contact layer separated by an oxide layer. The decoder further includes a number of single crystalline ultra thin vertical transistor that are selectively disposed adjacent the number of vertical pillars. Each single crystalline vertical transistor includes an ultra thin single crystalline vertical first source/drain region coupled to the first contact layer, an ultra thin single crystalline vertical second source/drain region coupled to the second contact layer, and an ultra thin single crystalline vertical body region which opposes the oxide layer and couples the first and the second source/drain regions. A plurality of buried source lines formed of single crystalline semiconductor material are disposed below the pillars in the array for interconnecting with the first contact layer of pillars in the array. And, each of the number of address lines is disposed in a trench between rows of the pillars for addressing the ultra thin single crystalline vertical body regions of the single crystalline vertical transistors that are adjacent to the trench.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art.

The illustrative embodiments described herein concern electrical circuitry which uses voltage levels to represent binary logic states—namely, a "high" logic level and a "low" logic level. Further, electronic signals used by the various embodiments of the present invention are generally considered active when they are high. However, a bar over the signal name in this application indicates that the signal is negative or inverse logic. Negative or inverse logic is considered active when the signal is low.

The term "horizontal" as used in this application is defined as a plane parallel to the conventional plane or surface of a wafer or substrate, regardless of the orientation of the wafer or the substrate. The term "vertical" refers to a direction perpendicular to the horizontal as defined above, Prepositions, such as "on," "side," (as in sidewall), "higher," "lower," "over," and "under" are defined with respect to the conventional plane or surface being on the top surface of the wafer or substrate, regardless of the orientation of the wafer or substrate. The following detailed description is not to be taken in a limiting sense, and the scope of the present invention is defined only by the appended claims.

Figure 1:
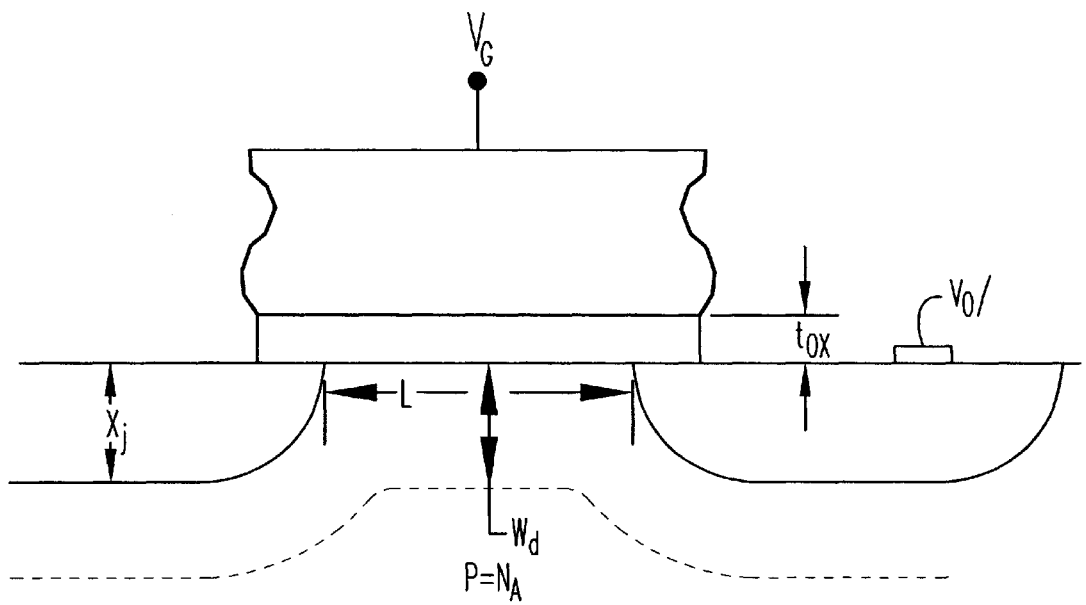
FIG. 1 is an illustration of a convention MOSFET transistor illustrating the shortcomings of such conventional MOSFETs as continuous scaling occurs to the deep submicron region where channel lengths are less than 0.1 micron, 100 nm, or 1000 A.
Figure 2:
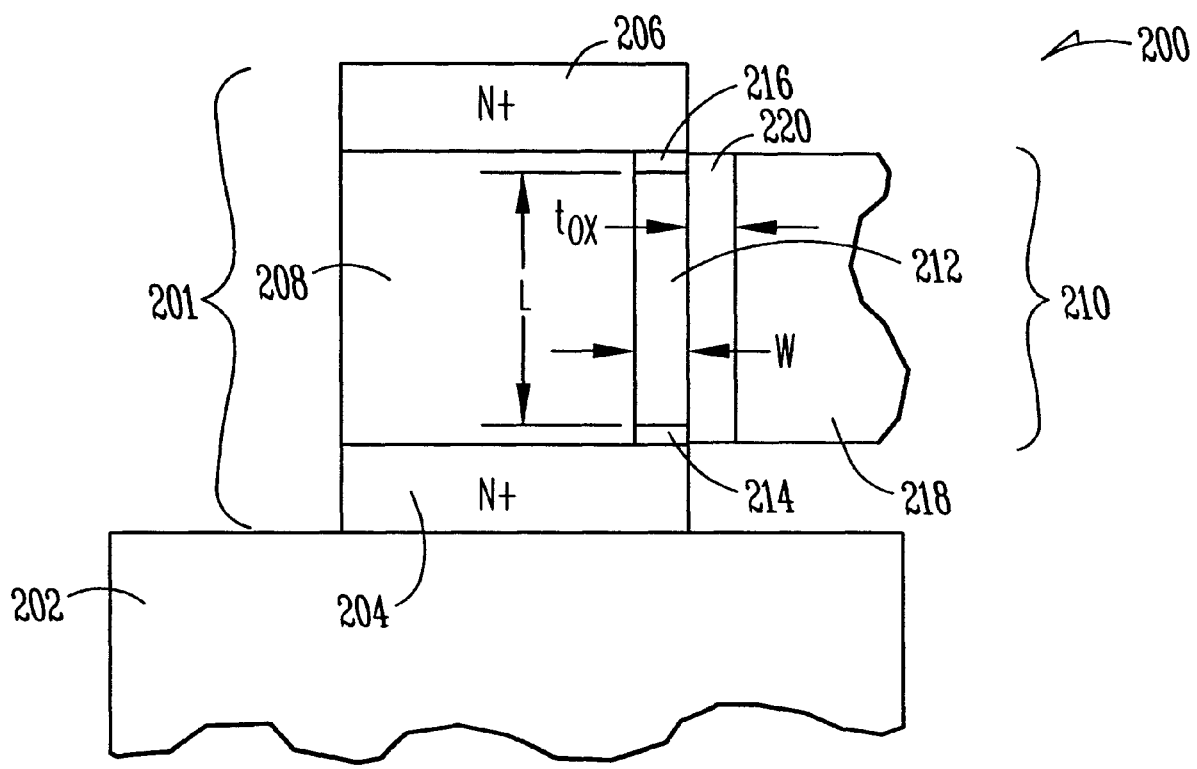
FIG. 2 is a diagram illustrating a vertical ultra thin body transistor formed along side of a pillar according to the teachings of the present invention.

FIG. 2 is a diagram illustrating an access FET 200 formed according to the teachings of the present invention which make up a portion of memory address and decode circuits. As shown in FIG. 2, access FET 200 includes a vertical ultra thin body transistor, or otherwise stated an ultra thin single crystalline vertical transistor. According to the teachings of the present invention, the structure of the access FET 200 includes a pillar 201 extending outwardly from a semiconductor substrate 202. The pillar includes a single crystalline first contact layer 204 and a single crystalline second contact layer 206 vertically separated by an oxide layer 208. An ultra thin single crystalline vertical transistor 210 is formed along side of the pillar 201. The ultra thin single crystalline vertical transistor 210 includes an ultra thin single crystalline vertical body region 212 which separates an ultra thin single crystalline vertical first source/drain region 214 and an ultra thin single crystalline vertical second source/drain region 216. A gate 218, which may be integrally formed with a word line as described above and below, is formed opposing the ultra thin single crystalline vertical body region 212 and is separated therefrom by a thin gate oxide layer 220.

According to embodiments of the present invention, the ultra thin single crystalline vertical transistor 210 includes a transistor having a vertical length of less than 100 nanometers and a horizontal width of less than 10 nanometers. Thus, in one embodiment, the ultra thin single crystalline vertical body region 212 includes a channel having a vertical length (L) of less than 100 nanometers. Also, the ultra thin single crystalline vertical body region 212 has a horizontal width (W) of less than 10 nanometers. And, the ultra thin single crystalline vertical first source/drain region 214 and an ultra thin single crystalline vertical second source/drain region 216 have a horizontal width of less than 10 nanometers. According to the teachings of the present invention, the ultra thin single crystalline vertical transistor 210 is formed from solid phase epitaxial growth.

An n-channel type transistor is shown in the embodiment of FIG. 2. However, one of ordinary skill in the art will further understand upon reading this disclosure that the conductivity types described herein can be reversed by altering doping types such that the present invention is equally applicable to include structures having ultra thin vertically oriented single crystalline p-channel type transistors. The invention is not so limited.

Figure 3A:
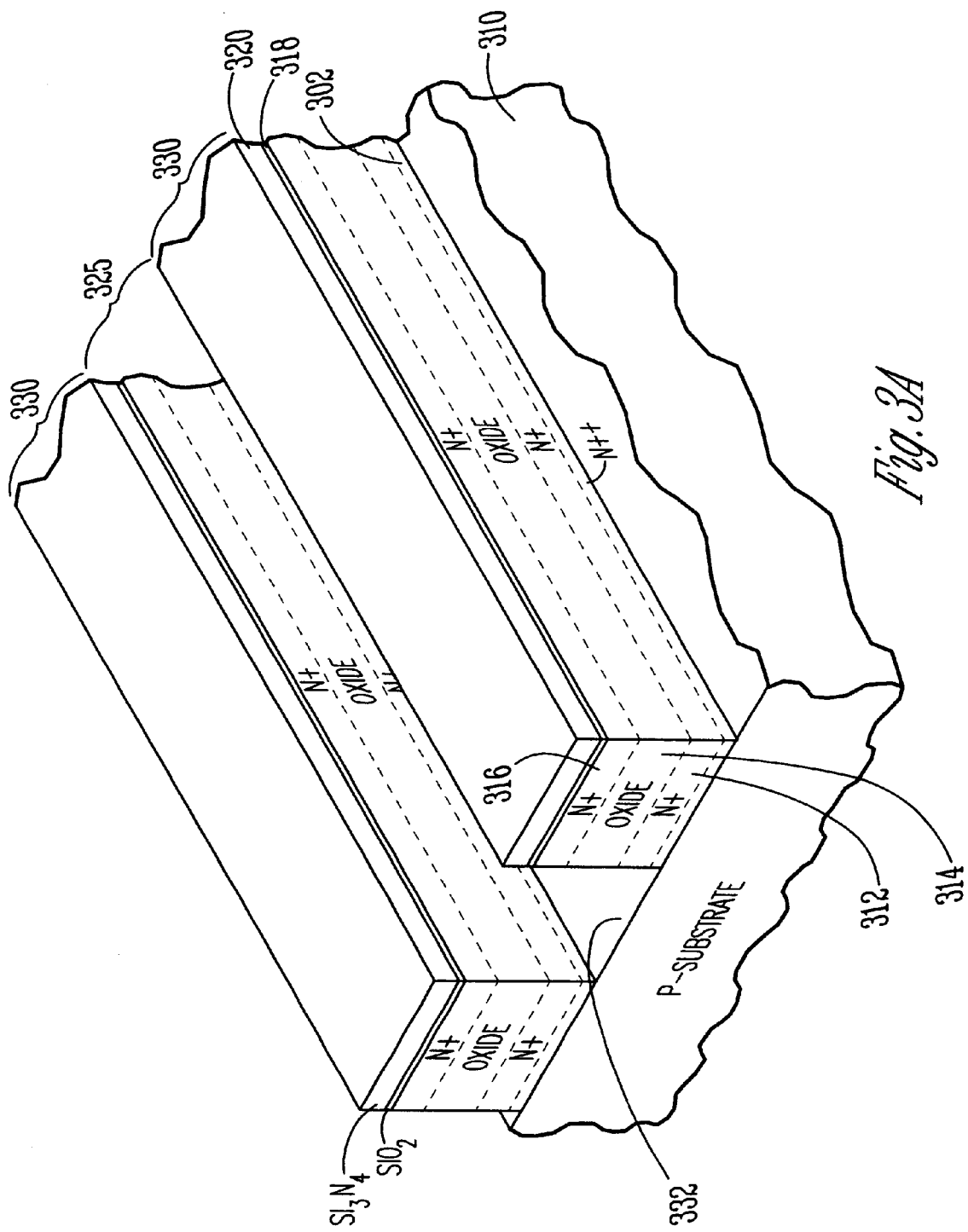
FIGS. 3A–3C illustrate an initial process sequence which for forming pillars along side of which vertical ultra thin body transistors can later be formed according to the teachings of the present invention.
Figure 3B:
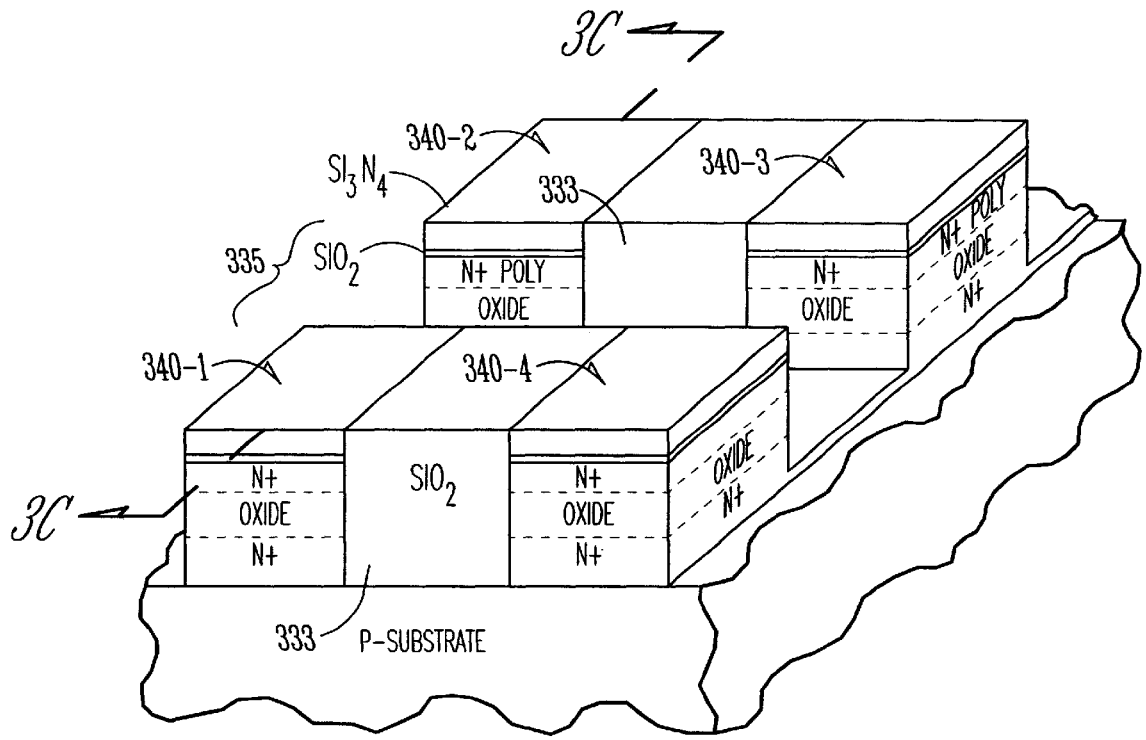
Figure 3C:
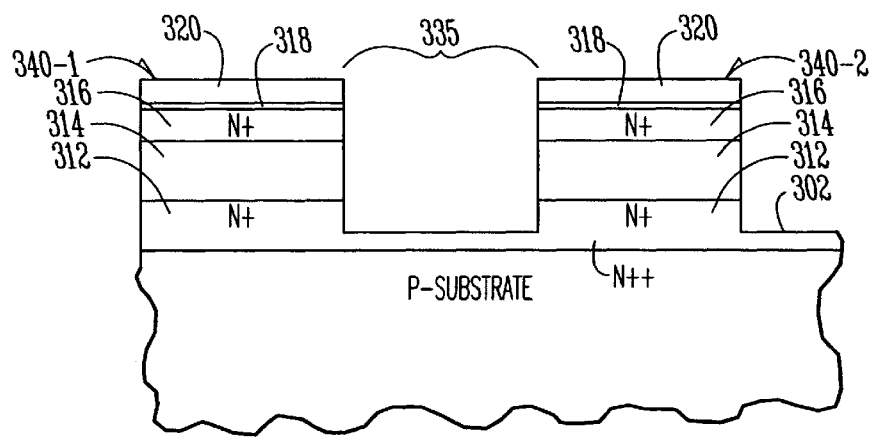

FIGS. 3A–3C illustrate an initial process sequence for forming pillars along side of which vertical ultra thin body transistors can later be formed as part of forming a memory address and decode circuit according to the teachings of the present invention. The dimensions suggested are appropriate to a 0.1 $\mu$m cell dimension (CD) technology and may be scaled accordingly for other CD sizes. In the embodiment of FIG. 3A, a p-type bulk silicon substrate 310 starting material is used. An n++ and n+ silicon composite first contact layer 312 is formed on substrate 310, such as by ion-implantation, epitaxial growth, or a combination of such techniques to form a single crystalline first contact layer 312. According to the teachings of the present invention, the more heavily conductively doped lower portion of the first contact layer 312 also functions as the bit line 302. The thickness of the n++ portion of first contact layer 312 is that of the desired bit line 302 thickness, which can be approximately between 0.1 to 0.25 $\mu$m. The overall thickness of the first contact layer 312 can be approximately between 0.2 to 0.5 $\mu$m. An oxide layer 314 of approximately 100 nanometers (nm), 0.1 $\mu$m, thickness or less is formed on the first contact layer 312. In one embodiment, the oxide layer 314 can be formed by thermal oxide growth techniques. A second contact layer 316 of n+ polycrystalline silicon is formed on the oxide layer 314. The second contact layer 316 is formed to a thickness of 100 nm or less.

Next, a thin silicon dioxide layer ($SiO_2$) 318 of approximately 10 nm is deposited on the second contact layer 316. A thicker silicon nitride layer ($Si_3N_4$) 320 of approximately 100 nm in thickness is deposited on the thin silicon dioxide layer ($SiO_2$) 318 to form pad layers, e.g. layers 318 and 320. These pad layers 318 and 320 can be deposited using any suitable technique such as by chemical vapor deposition (CVD).

A photoresist is applied and selectively exposed to provide a mask for the directional etching of trenches 325, such as by reactive ion etching (RIE). The directional etching results in a plurality of column bars 330 containing the stack of nitride layer 320, pad oxide layer 318, second contact layer 316, oxide layer 314, and first contact layer 312. Trenches 325 are etched to a depth that is sufficient to reach the surface 332 of substrate 310, thereby providing separation between conductively doped bit lines 302. The photoresist is removed. Bars 330 are now oriented in the direction of bit lines 302, e.g. column direction. In one embodiment, bars 330 have a surface line width of approximately 0.1 micron or less. The width of each trench 325 can be approximately equal to the line width of bars 330. The structure is now as appears in FIG. 3A.

In FIG. 3B, isolation material 333, such as $SiO_2$ is deposited to fill the trenches 325. The working surface is then planarized, such as by chemical mechanical polishing/planarization (CMP). A second photoresist is applied and selectively exposed to provide a mask for the directional etching of trenches 335 orthogonal to the bit line 302 direction, e.g. row direction. Trenches 335 can be formed using any suitable technique such as by reactive ion etching (RIE). Trenches 335 are etched through the exposed $SiO_2$ and the exposed stack of nitride layer 320, pad oxide layer 318, second contact layer 316, oxide layer 314, and into the first contact layer 312 but only to a depth sufficient to leave the desired bit line 302 thickness, e.g. a remaining bit line thickness of typically 100 nm. The structure is now as appears in FIGS. 3B having individually defined pillars 340-1, 340-2, 340-3, and 340-4.

FIG. 3C illustrates a cross sectional view of the structure shown in FIG. 3B taken along cut-line 3C—3C. FIG. 3C shows the continuous bit line 302 connecting adjacent pillars 340-1 and 340-2 in any given column. Trench 335 remains for the subsequent formation of wordlines, as described below, in between adjacent rows of the pillars, such as a row formed by pillars 340-1 and 340-4 and a row formed by pillars 340-2, and 340-3.

Figure 4A:
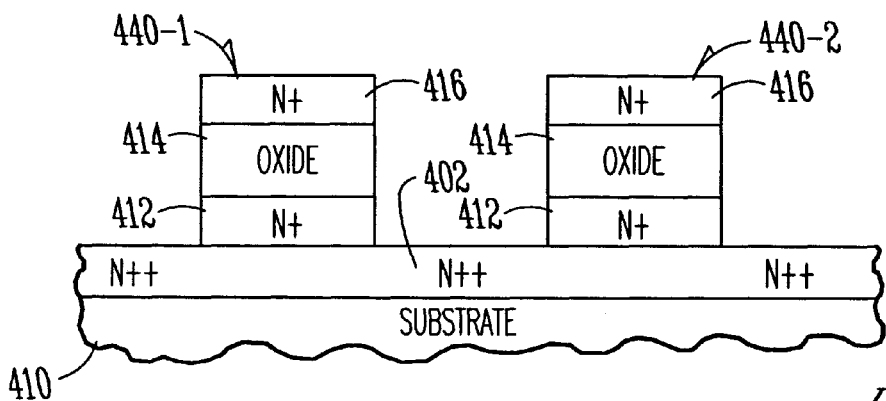
FIGS. 4A–4C illustrate that the above techniques described in connection with FIGS. 3A–3C can be implemented with a bulk CMOS technology or a silicon on insulator (SOI) technology.
Figure 4B:
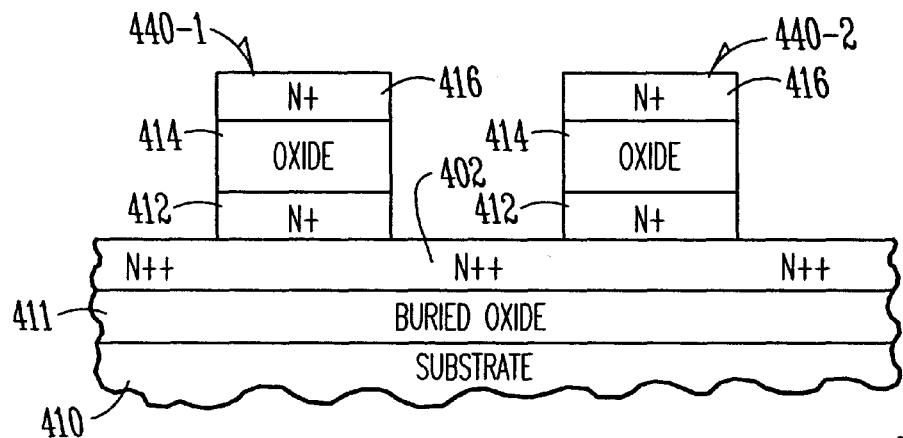
Figure 4C:
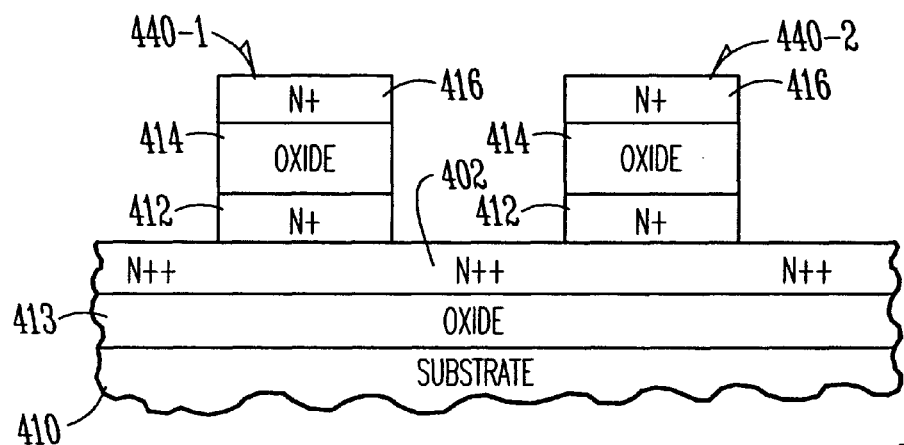

FIGS. 4A–4C illustrate that the above techniques described in connection with FIGS. 3A–3C can be implemented on a bulk CMOS technology substrate or a silicon on insulator (SOI) technology substrate. FIG. 4A represents the completed sequence of process steps shown in FIGS. 3A–3C, minus the pad layers, formed on a lightly doped p-type bulk silicon substrate 410. The structure shown in FIG. 4A is similar to the cross sectional view in FIG. 3C and shows a continuous bit line 402 with pillar stacks 440-1 and 440-2 formed thereon. The pillars 440-1 and 440-2 include an n+ first contact layer 412, an oxide layer 414 formed thereon, and a second n+ contact layer 416 formed on the oxide layer 414.

FIG. 4B represents the completed sequence of process steps shown in FIGS. 3A–3C, minus the pad layers, formed on a commercial SOI wafer, such as SIMOX. As shown in FIG. 4B, a buried oxide layer 411 is present on the surface of the substrate 410. The structure shown in FIG. 4B is also similar to the cross sectional view in FIG. 3C and shows a continuous bit line 402 with pillar stacks 440-1 and 440-2 formed thereon, only here the continuous bit line 402 is separated from the substrate 410 by the buried oxide layer 411. Again, the pillars 440-1 and 440-2 include an n+ first contact layer 412, an oxide layer 414 formed thereon, and a second n+ contact layer 416 formed on the oxide layer 414.

FIG. 4C represents the completed sequence of process steps shown in FIGS. 3A–3C, minus the pad layers, forming islands of silicon on an insulator, where the insulator 413 has been formed by oxide under cuts. Such a process includes the process described in more detail in U.S. Pat. No. 5,691,230, by Leonard Forbes, entitled "Technique for Producing Small Islands of Silicon on Insulator," issued Nov. 25, 1997, which is incorporated herein by reference. The structure shown in FIG. 4C is also similar to the cross sectional view in FIG. 3C and shows a continuous bit line 402 with pillar stacks 440-1 and 440-2 formed thereon, only here the continous bit line 402 is separated from the substrate 410 by the insulator 413 which has been formed by oxide under cuts such as according to the process referenced above. Again, the pillars 440-1 and 440-2 include an n+ first contact layer 412, an oxide layer 414 formed thereon, and a second n+ contact layer 416 formed on the oxide layer 414. Thus, according to the teachings of the present invention, the sequence of process steps to form pillars, as shown in FIGS. 3A–3C, can include forming the same on at least three different types of substrates as shown in FIGS. 4A–4C.

Figure 5A:
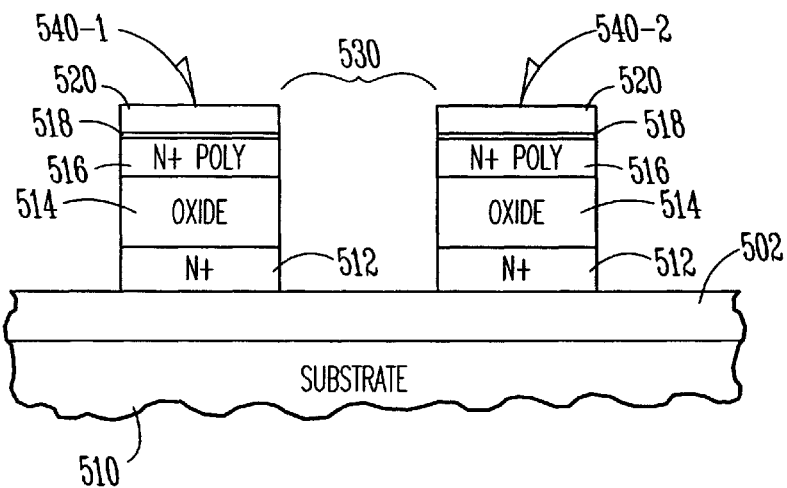
FIGS. 5A–5D illustrate a process sequence continuing from the pillar formation embodiments provided in FIGS. 5A–6C to form vertical ultra thin body transistors along side of the pillars.
Figure 5B:
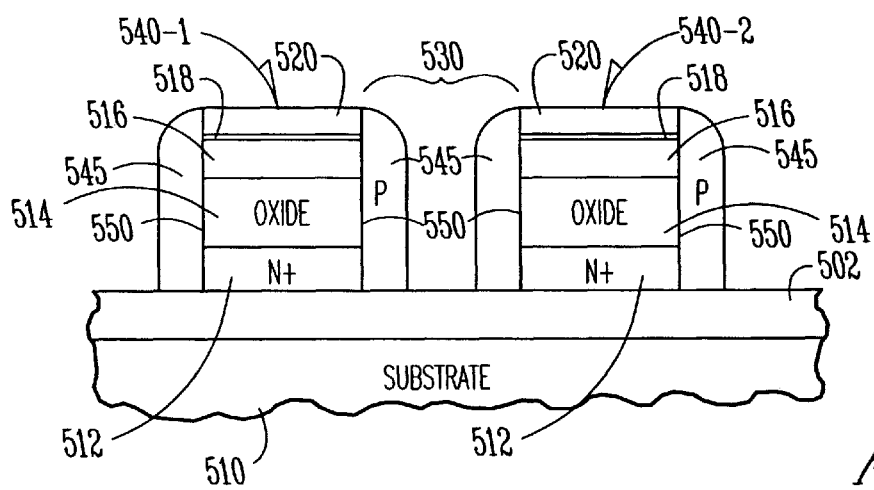
Figure 5C:
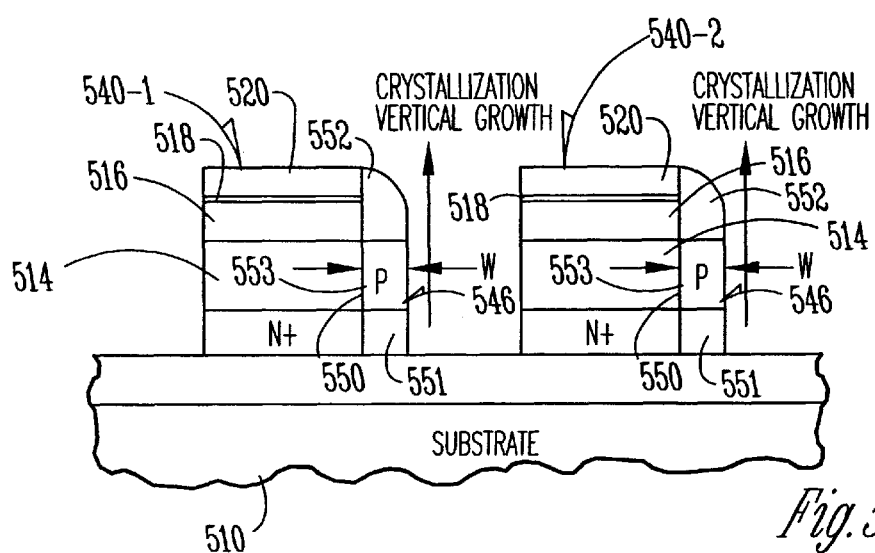

FIGS. 5A–5C illustrate a process sequence continuing from the pillar formation embodiments provided in FIGS. 3A–3C, and any of the substrates shown in FIGS. 4A–4C, to form vertical ultra thin body transistors along side of the pillars, such as pillars 340-1 and 340-2 in FIG. 3C. For purposes of illustration only, FIG. 5A illustrates an embodiment pillars 540-1 and 540-2 formed on a p-type substrate 510 and separated by a trench 530. Analogous to the description provided in connection FIGS. 5A–5C, FIG. 5A shows a first single crystalline n+ contact layer 512 a portion of which, in one embodiment, is integrally formed with an n++ bit line 502. An oxide layer region 514 is formed in pillars 540-1 and 540-2 on the first contact layer 512. A second n+ contact layer 516 is shown formed on the oxide layer region 514 in the pillars 540-1 and 540-2. And, pad layers of ($SiO_2$) 518 and ($Si_3N_4$) 520, respectively are shown formed on the second contact layer 516 in the pillars 540-1 and 540-2.

In FIG. 5B, a lightly doped p-type polysilicon layer 545 is deposited over the pillars 540-1 and 540-2 and directionally etched to leave the lightly doped p-type material 545 on the sidewalls 550 of the pillars 540-1 and 540-2. In one embodiment according to the teachings of the present invention, the lightly doped p-type polysilicon layer is directionally etched to leave the lightly doped p-type material 545 on the sidewalls 550 of the pillars 540-1 and 540-2 having a width (W), or horizontal thickness of 10 nm or less. The structure is now as shown in FIG. 5B.

The next sequence of process steps is described in connection with FIG. 5C. At this point another masking step, as the same has been described above, can be employed to isotropically etch the polysilicon 545 off of some of the sidewalls 550 and leave polysilicon 545 only on one sidewall of the pillars 540-1 and 540-2 if this is required by some particular configuration, e.g. forming ultra thin body transistors only on one side of pillars 540-1 and 540-2.

In FIG. 5C, the embodiment for forming the ultra thin single crystalline vertical transistors, or ultra thin body transistors, only on one side of pillars 540-1 and 540-2 is shown. In FIG. 5C, the wafer is heated at approximately 550 to 700 degrees Celsius. In this step, the polysilicon 545 will recrystallize and lateral epitaxial solid phase regrowth will occur vertically. As shown in FIG. 5C, the single crystalline silicon at the bottom of the pillars 540-1 and 540-2 will seed this crystal growth and an ultrathin single crystalline film 546 will form which can be used as the channel of an ultra thin single crystalline vertical MOSFET transistor. In the embodiment of FIG. 5C, where the film is left only on one side of the pillar, the crystallization will proceed vertically and into the n+ polysilicon second contact material/layer 516 on top of the pillars 540-1 and 540-2. If however, both sides of the pillars 540-1 and 540-2 are covered, the crystallization will leave a grain boundary near the center on top of the pillars 540-1 and 540-2. This embodiment is shown in FIG. 5D.

Figure 5D:
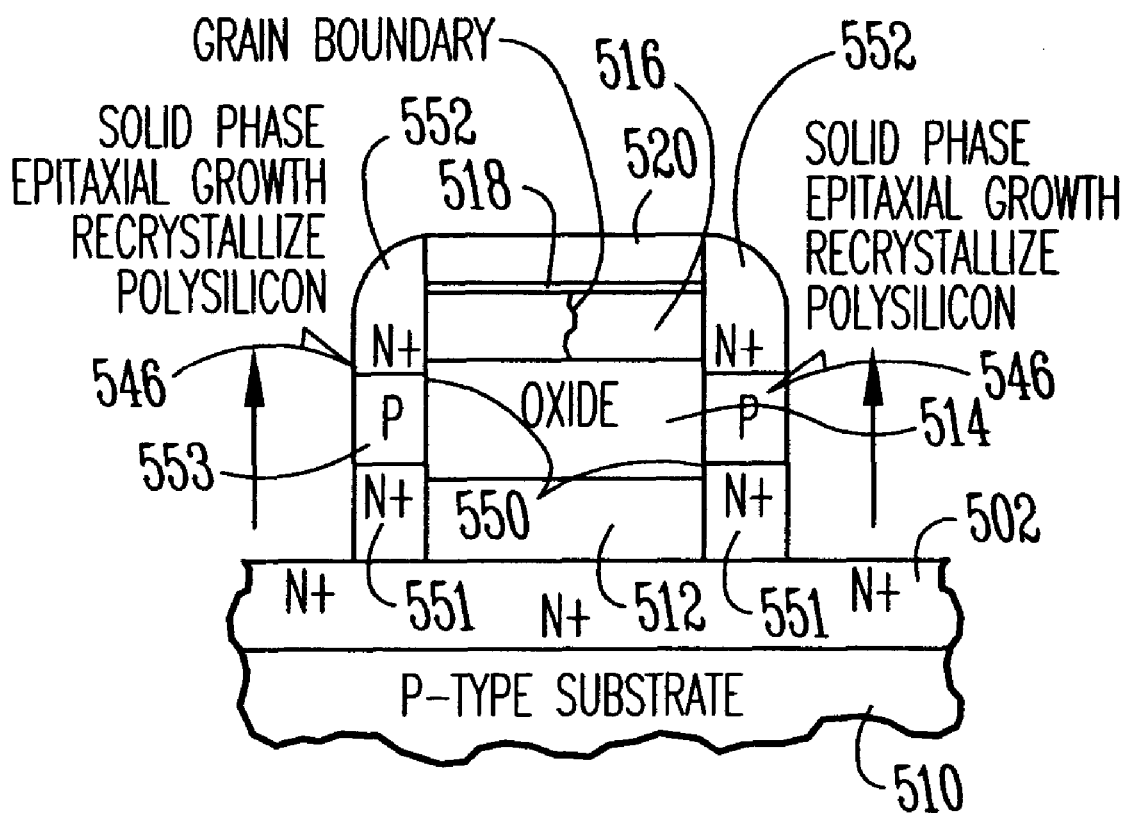

As shown in FIGS. 5C and 5D, drain and source regions, 551 and 552 respectively, will be formed in the ultrathin single crystalline film 546 along the sidewalls 550 of the pillars 540-1 and 540-2 in the annealing process by an out diffusion of the n+ doping from the first and the second contact layers, 512 and 516. In the annealing process, these portions of the ultrathin single crystalline film 546, now with the n+ dopant, will similarly recrystallize into single crystalline structure as the lateral epitaxial solid phase regrowth occurs vertically. The drain and source regions, 551 and 552, will be separated by a vertical single crystalline body region 553 formed of the p-type material. In one embodiment of the present invention, the vertical single crystalline body region will have a vertical length of less than 100 nm. The structure is now as shown in FIGS. 5C or 5D. As one of ordinary skill in the art will understand upon reading this disclosure. A conventional gate insulator can be grown or deposited on this ultrathin single crystalline film 546. And, either horizontal or vertical gate structures can be formed in trenches 530.

As one of ordinary skill in the art will understand upon reading this disclosure, drain and source regions, 551 and 552 respectively, have been formed in an ultrathin single crystalline film 546 to form a portion of the ultra thin single crystalline vertical transistors, or ultra thin body transistors, according to the teachings of the present invention. The ultrathin single crystalline film 546 now includes an ultra thin single crystalline vertical first source/drain region 551 coupled to the first contact layer 512 and an ultra thin single crystalline vertical second source/drain region 552 coupled to the second contact layer 516. An ultra thin p-type single crystalline vertical body region 553 remains along side of, or opposite, the oxide layer 514 and couples the first source/drain region 551 to the second source/drain region 552. In effect, the ultra thin p-type single crystalline vertical body region 553 separates the drain and source regions, 551 and 552 respectively, and can electrically couple the drain and source regions, 551 and 552, when a channel is formed therein by an applied potential. The drain and source regions, 551 and 552 respectively, and the ultra thin body region 553 are formed of single crystalline material by the lateral solid phase epitaxial regrowth which occurs in the annealing step.

The dimensions of the structure now include an ultra thin single crystalline body region 553 having a vertical length of less than 100 nm in which a channel having a vertical length of less than 100 nm can be formed. Also, the dimensions include drain and source regions, 551 and 552 respectively, having a junction depth defined by the horizontal thickness of the ultrathin single crystalline film 546, e.g. less than 10 nm. Thus, the invention has provided junction depths which are much less than the channel length of the device and which are scalable as design rules further shrink. Further, the invention has provided a structure for transistors with ultra thin bodies so that a surface space charge region in the body of the transistor scales down as other transistor dimensions scale down. In effect, the surface space charge region has been minimized by physically making the body region of the MOSFET ultra thin, e.g. 10 nm or less.

One of ordinary skill in the art will further understand upon reading this disclosure that the conductivity types described herein can be reversed by altering doping types such that the present invention is equally applicable to include structures having ultra thin vertically oriented single crystalline p-channel type transistors. The invention is not so limited. From the process descriptions described above, the fabrication process can continue to form a number of different horizontal and vertical gate structure embodiments in the trenches 530 as described in connection with the Figures below.

Figure 6A:
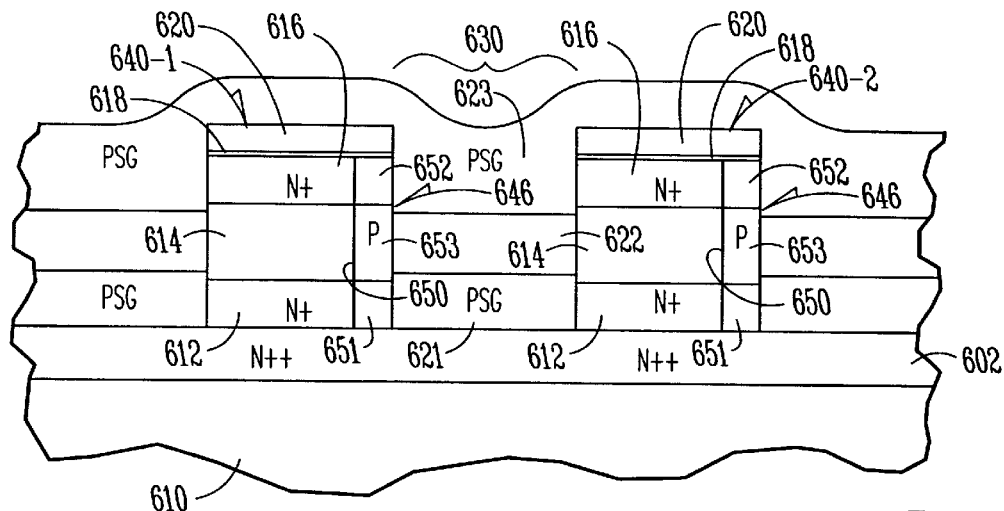
FIGS. 6A–6C illustrate a process sequence for forming a horizontal gate structure embodiment, referred to herein as horizontal replacement gates, in connection with the present invention.
Figure 6B:
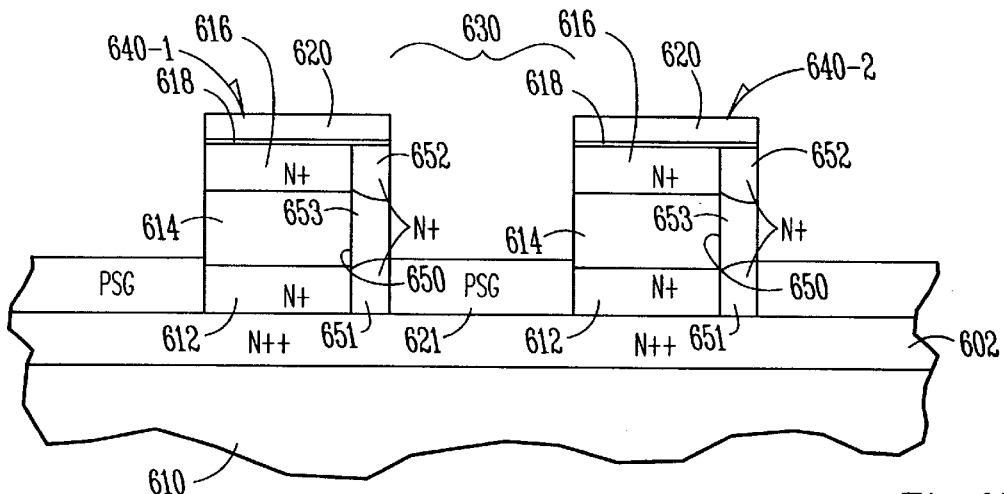
Figure 6C:
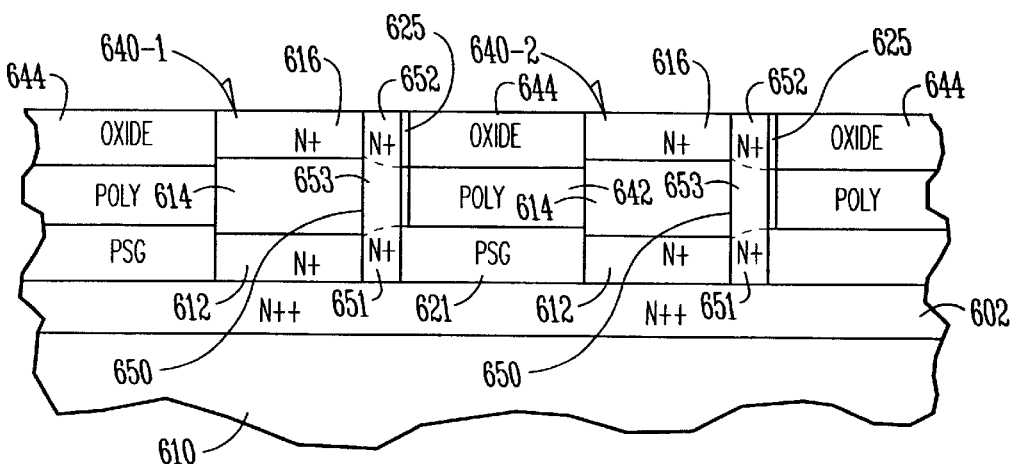

FIGS. 6A–6C illustrate a process sequence for forming a horizontal gate structure embodiment, referred to herein as horizontal replacement gates, in connection with the present invention. The dimensions suggested in the following process steps are appropriate to a 0.1 micrometer CD technology and may be scaled accordingly for other CD sizes. FIG. 6A represents a structure similar to that shown in FIG. 5C. That is FIG. 6A shows an ultrathin single crystalline film 646 along the sidewalls 650 of pillars 640-1 and 640-2 in trenches 630. The ultrathin single crystalline film 646 at this point includes an ultra thin single crystalline vertical first source/drain region 651 coupled to a first contact layer 612 and an ultra thin single crystalline vertical second source/drain region 652 coupled to a second contact layer 616. An ultra thin p-type single crystalline vertical body region 653 is present along side of, or opposite, an oxide layer 614 and couples the first source/drain region 651 to the second source/drain region 652. According to the process embodiment shown in FIG. 6A an n+ doped oxide layer 621, or PSG layer as the same will be known and understood by one of ordinary skill in the art will understand, is deposited over the pillars 640-1 and 640-2 such as by a CVD technique. This n+ doped oxide layer 621 is then planarized to remove off of the top surface of the pillars 640-1 and 640-2. An etch process is performed to leave about 50 nm at the bottom of trench 630. Next, an undoped polysilicon layer 622 or undoped oxide layer 622 is deposited over the pillars 640-1 and 640-2 and CMP planarized to again remove from the top surface of the pillars 640-1 and 640-2. Then, the undoped polysilicon layer 622 is etched, such as by RIE to leave a thickness of 100 nm or less in the trench 630 along side of, or opposite oxide layer 614. Next, another n+ doped oxide layer 623, or PSG layer as the same will be known and understood by one of ordinary skill in the art will understand, is deposited over the pillars 640-1 and 640-2 such as by a CVD process. The structure is now as appears in FIG. 6A.

FIG. 6B illustrates the structure following the next sequence of fabrication steps. In FIG. 6B, a heat treatment is applied to diffuse the n-type dopant out of the PSG layers, e.g. 621 and 623 respectively, into the vertical ultrathin single crystalline film 646 to additionally form the drain and source regions, 651 and 652 respectively. Next, as shown in FIG. 6B, a selective etch is performed, as the same will be known and understood by one of ordinary skill in the art upon reading this disclosure, to remove the top PSG layer 623 and the undoped polysilicon layer 622, or oxide layer 622 in the trench 630. The structure is now as appears in FIG. 6B.

Next, in FIG. 6C, a thin gate oxide 625 is grown as the same will be known and understood by one of ordinary skill in the art, such as by thermal oxidation, for the ultra thin single crystalline vertical transistors, or ultra thin body transistors on the surface of the ultra thin single crystalline vertical body region 653 for those transistors in alternating, row adjacent pillars which will be connected to trench wordlines for completing the memory address and decode circuit device. Next, a doped n+ type polysilicon layer 642 can be deposited to form a gate 642 for the ultra thin single crystalline vertical transistors, or ultra thin body transistors. The structure then undergoes a CMP process to remove the doped n+ type polysilicon layer 642 from the top surface of the pillars 640-1 and 640-2 and RIE etched to form the desired thickness of the gate 642 for the ultra thin single crystalline vertical transistors, or ultra thin body transistors. In one embodiment, the doped n+ type polysilicon layer 642 is RIE etched to form an integrally formed, horizontally oriented word line/gate having a vertical side of less than 100 nanometers opposing the ultra thin single crystalline vertical body region 653. Next, an oxide layer 644 is deposited such as by a CVD process and planarized by a CMP process to fill trenches 630. An etch process is performed, as according to the techniques described above to strip the nitride layer 620 from the structure. This can include a phosphoric etch process using phosphoric acid. The structure is now as appears as is shown in FIG. 6C.

As one of ordinary skill in the art will understand upon reading this disclosure, contacts can be formed to the second contact layer 616 on top of the pillars 640-1 and 640-2 to continue with capacitor formation and standard BEOL processes.

Figure 7A:
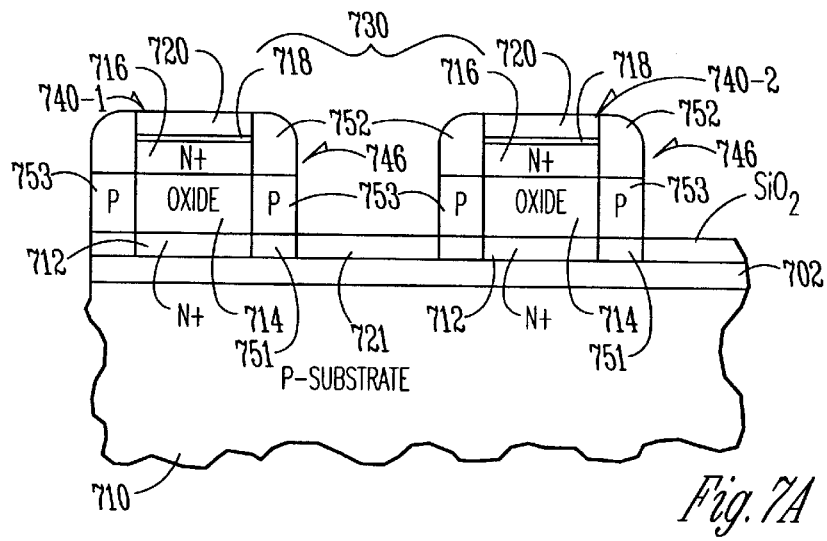
FIGS. 7A–7D illustrate a process sequence for forming a vertical gate structure embodiment, in connection with the present invention.

FIGS. 7A–7D illustrate a process sequence for forming a vertical gate structure embodiment according to the teachings of the present invention. The dimensions suggested in the following process steps are appropriate to a 0.1 micrometer CD technology and may be scaled accordingly for other CD sizes. FIG. 7A represents a structure similar to that shown in FIG. 5C. That is FIG. 7A shows an ultrathin single crystalline film 746 along the sidewalls 750 of pillars 740-1 and 740-2 in trenches 730. The ultrathin single crystalline film 746 at this point includes an ultra thin single crystalline vertical first source/drain region 751 coupled to a first contact layer 712 and an ultra thin single crystalline vertical second source/drain region 752 coupled to a second contact layer 716. An ultra thin p-type single crystalline vertical body region 753 is present along side of, or opposite, an oxide layer 714 and couples the first source/drain region 751 to the second source/drain region 752. According to the process embodiment shown in FIG. 7A, a conformal nitride layer of approximately 20 nm is deposited, such as by CVD, and directionally etched to leave only on the sidewalls 750. A oxide layer is then grown, such as by thermal oxidation, to a thickness of approximately 50 nm in order to insulate the exposed bit line bars 702. The conformal nitride layer on the sidewalls 750 prevents oxidation along the ultrathin single crystalline film 746. The nitride layer is then stripped, using conventional stripping processes as the same will be known and understood by one of ordinary skill in the art. The structure is now as appears in FIG. 7A.

Figure 7B:
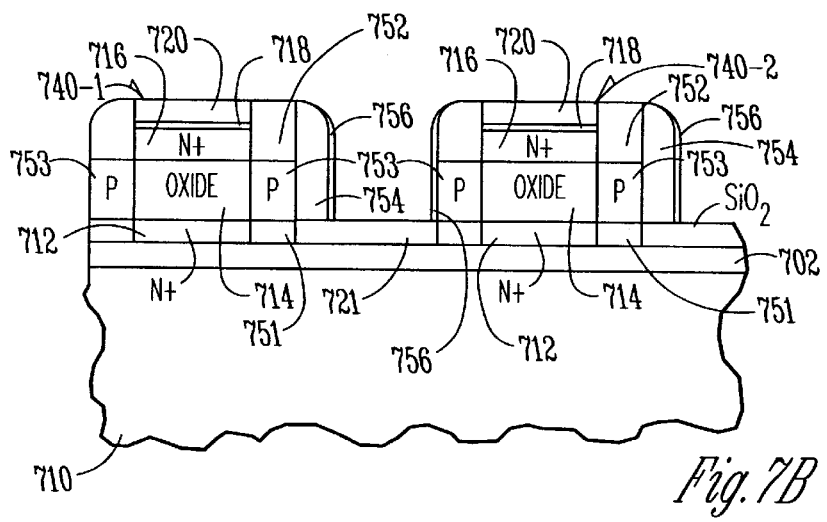

As shown in FIG. 7B, an intrinsic polysilicon layer 754 is deposited over the pillars 740-1 and 740-2 and in trenches 730 and then directionally etched to leave the intrinsic polysilicon layer 754 only on the vertical sidewalls of the pillars 740-1 and 740-2. A photoresist is applied and masked to expose pillar sides where device channels are to be formed, e.g. integrally formed wordline/gates on alternating, row adjacent pillars. In these locations, the intrinsic polysilicon layer 754 is selectively etched, as the same will be known and understood by one of ordinary skill in the art, to remove the exposed intrinsic polysilicon layer 754. Next, a thin gate oxide layer 756 is grown on the exposed sidewalls of the ultrathin single crystalline film 746 for the ultra thin single crystalline vertical transistors, or ultra thin body transistors. The structure is now as appears in FIG. 7B.

Figure 7C:
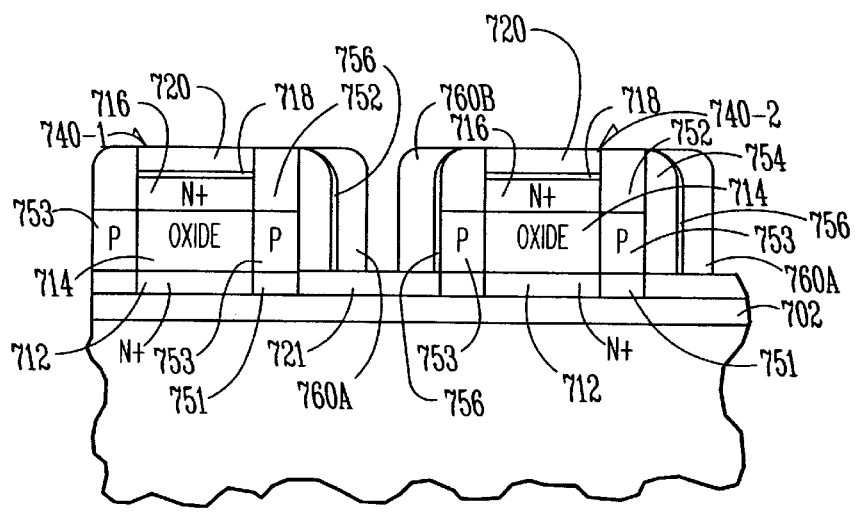

In FIG. 7C, a wordline conductor of an n+ doped polysilicon material or suitable metal 750 is deposited, such as by CVD, to a thickness of approximately 50 nm or less. This wordline conductor 750 is then directionally etched to leave only on the vertical sidewalls of the pillars, including on the thin gate oxide layers 756 of alternating, row adjacent pillars in order to form separate vertical, integrally formed wordline/gates 760A and 760B. The structure is now as appears in FIG. 7C.

Figure 7D:
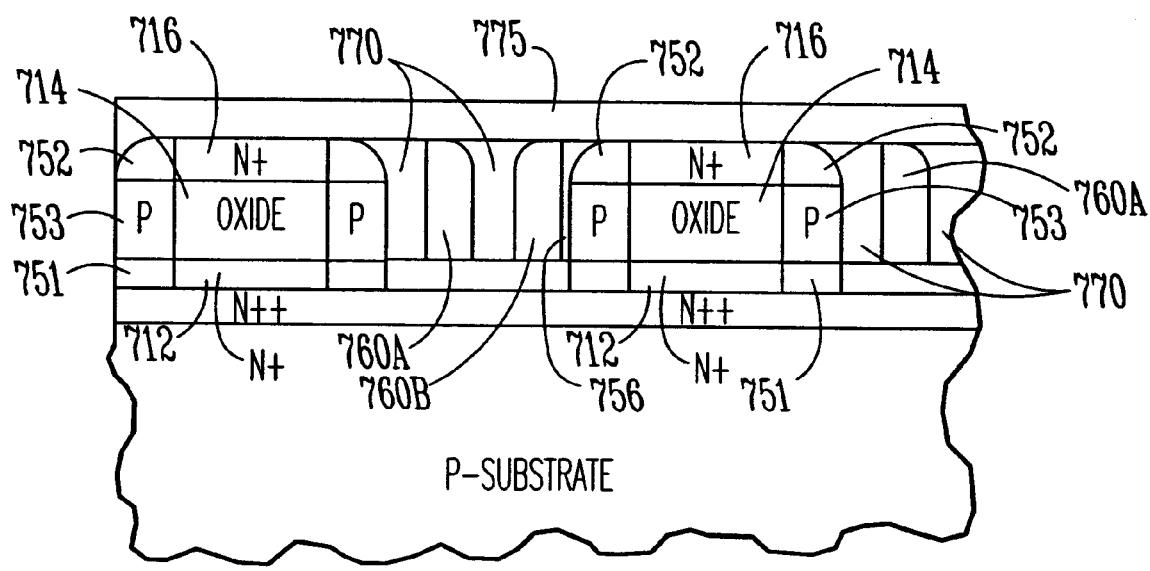

In FIG. 7D, a brief oxide etch is performed to expose the top of the remaining intrinsic polysilicon layer 754. Then, a selective isotropic etch is performed, as the same will be known and understood by one of ordinary skill in the art, in order to remove all of the remaining intrinsic polysilicon layer 754. An oxide layer 770 is deposited, such as by CVD, in order to fill the cavities left by removal of the intrinsic polysilicon layer and the spaces in the trenches 730 between the separate vertical wordlines 760A and 760B neighboring pillars 740-1 and 740-2. As mentioned above, the separate vertical wordlines will integrally form gates on alternating, row adjacent pillars. The oxide layer 770 is planarized by CMP to remove from the top of the pillars 740-1 and 740-2 stopping on the nitride pad 720. Then the remaining pad material 718 and 720 is etched, such as by RIE, to remove from the top of the pillars 740-1 and 740-2. Next, deposit CVD oxide 775 to cover the surface of the pillars 740-1 and 740-2. The structure is now as appears in FIG. 7D.

As one of ordinary skill in the art will understand upon reading this disclosure, the process can now proceed with storage capacitor formation and BEOL process steps.

As one of ordinary skill in the art will understand upon reading this disclosure, the process steps described above produce integrally formed vertically oriented wordlines 760A and 760B which serve as integrally formed vertical gates along the sides of alternating, row adjacent pillars.

Figure 8:
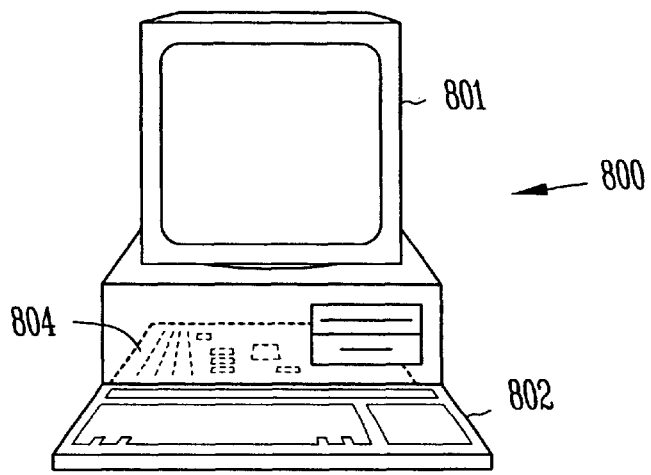
FIG. 8 is a block diagram of an embodiment of a computer according to the teachings of the present invention.
Figure 9:
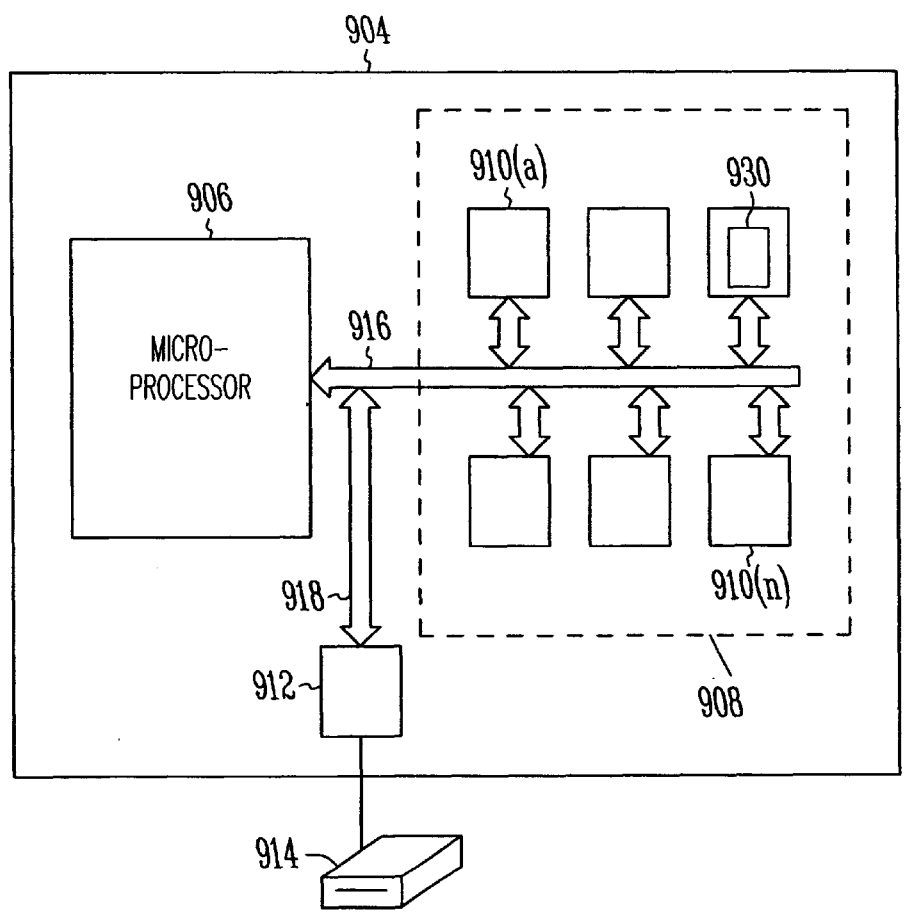
FIG. 9 is a block diagram of an embodiment of an interface for a microprocessor and a memory device for the computer of FIG. 8.

FIGS. 8 and 9 illustrate an embodiment of the present invention. In the embodiment of FIG. 8 a personal computer is shown. The personal computer 800 of FIG. 8 is just one example of an electronic system 800 in which the invention may be practiced. In FIG. 8, the personal computer 800 includes a monitor 801, a keyboard input 802, and a central processing unit 804.

FIG. 9 illustrates one embodiment of the processing unit 904 in more detail. As shown in FIG. 9, the processing unit 904 typically includes a microprocessor 906, a memory bus circuit 908 having a plurality of memory slots 910(a–n), and other peripheral circuitry 912. Peripheral circuitry 912 permits various peripheral devices 914 to interface the processor-memory bus 916 over the input/output (I/O) bus 918.

The microprocessor 906 produces control and address signals to control the exchange of data between the memory bus circuit 908 and the microprocessor 906, and between the memory bus circuit 908 and the peripheral circuitry 912. This exchange of data is accomplished over the high speed memory bus 916 and over the high speed I/O bus 918.

Figure 10:
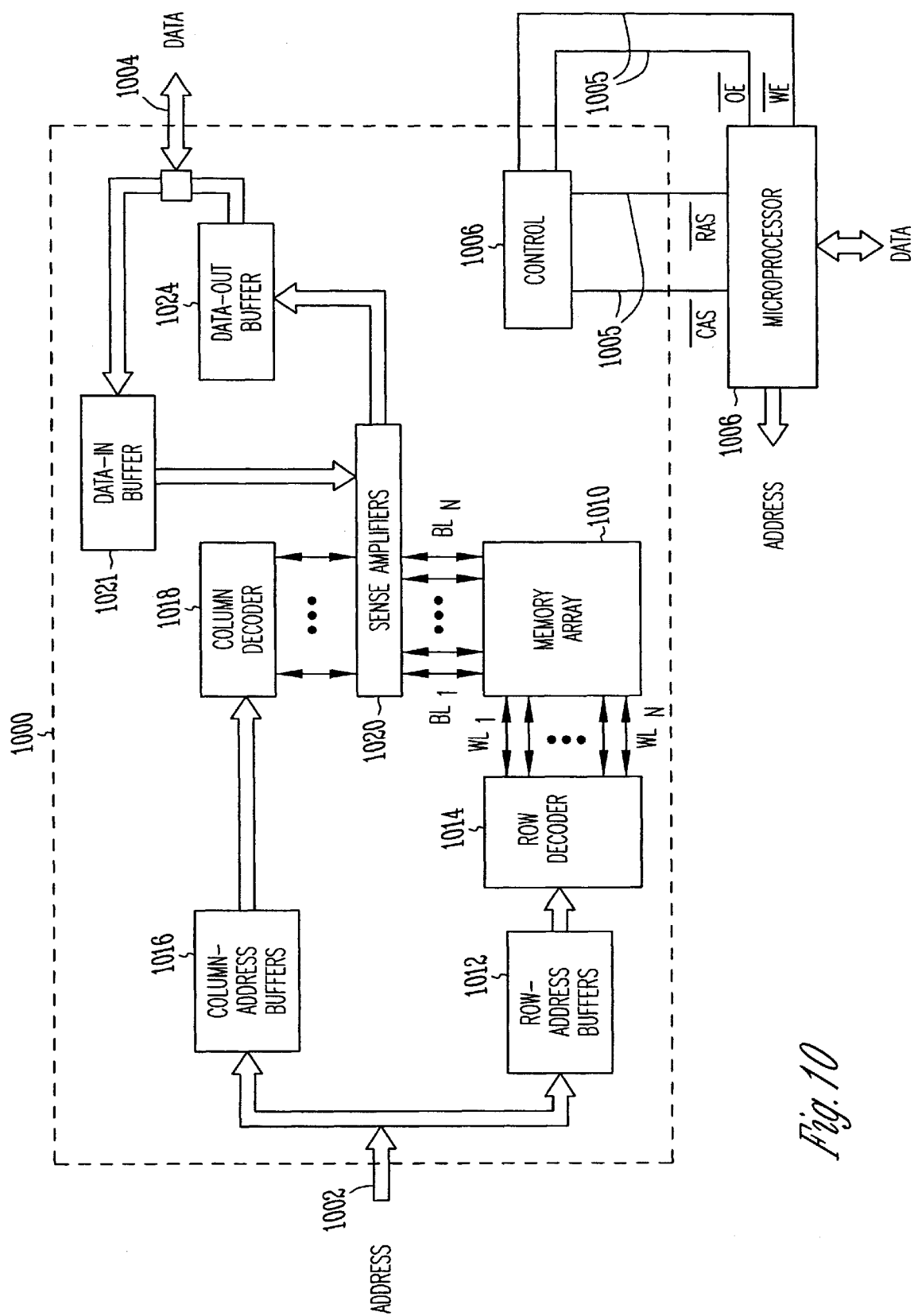
FIG. 10 is a block diagram illustrating generally an embodiment of an architecture of a memory circuit according to the teachings of the present invention.

A plurality of memory slots 910(a–n) are coupled to the memory bus 916 for receiving memory devices 930. Memory devices 930 include address decoder circuits that are formed with vertical transistors as described in more detail below. Memory devices 930 include, but are not limited to the following types: static random access memory (SRAM), dynamic random access memory (DRAM), synchronous dynamic random access memory (SDRAM), erasable programmable read-only memory (EPROM), electrically erasable programmable read-only memory (EEPROM), or Flash memories. A memory device 930 is illustrated in FIG. 10 in one of the memory slots 910(a–n). A memory device 930 may be packaged as a single in-line memory module (SIMM) or a dual in-line memory module (DIMM), or any other packaging schemes well known in the art.

FIG. 10 is a block diagram that illustrates another embodiment of the present invention. DRAM device 1000 is compatible with the memory slots 910(a–n). The description of the DRAM 1000 has been simplified for purposes of illustrating a DRAM memory device and is not intended to be a complete description of all the features of a DRAM. Address information is provided on input line 1002, data information is provided on input line 1004, and control input is provided on a variety of input lines 1005 directed to a control logic 1006. Input lines 1002, 1004, and 1005 correspond to individual inputs from the memory bus 916, for example, illustrated in FIG. 9.

The DRAM 1000 includes a memory array 1010 which in turn comprises rows and columns of addressable memory cells. Each memory cell in a row is coupled to a common wordline, as illustrated by lines $WL_1–WL_n$. Additionally, each memory cell in a column is coupled to a common bitline, as illustrated by lines $BL_1–BL_n$. Each cell in the memory array 1010 includes a storage capacitor and a vertical access transistor.

The DRAM 1000 interfaces with, for example, the microprocessor 1006 through address lines 1002 and data lines 1004. Alternatively, DRAM 1000 may interface with a DRAM controller, a micro-controller, a chip set or other electronic system. The microprocessor 1006 also provides a number of control signals to the DRAM 1000 via the control lines 1005, including but not limited to, row and column address strobe signals RAS* and CAS*, write enable signal WE*, an output enable signal OE* and other conventional control signals.

A row address buffer 1012 and a row decoder 1014 receive and decode row addresses from row address signals provided on address lines 1002 by, for example, the microprocessor 1006. Each unique row address corresponds to a row of cells in the memory array 1010. The row decoder 1014 includes a wordline driver, an address decoder tree, and circuitry which translates a given row address received from the row address buffers 1012 and selectively activates the appropriate wordline of the memory array 1010 via the wordline drivers.

A column address buffer 1016 and a column decoder 1018 receive and decode column address signals provided on the address lines 1002 by the microprocessor 1006. Each unique column address corresponds to a column of cells in the memory array 1010. The column decoder 1018 also determines when a column is defective and the address of the replacement column. The column decoder 1018 is coupled to sense amplifiers 1020. The sense amplifiers 1020 are coupled to complementary pairs of bitlines of the memory array 1010.

The sense amplifiers 1020 are coupled to a data-in buffer 1021 and a data-out buffer 1024. The data-in buffers 1021 and the data-out buffers 1024 are coupled to the data lines 1004. During a write operation, the data lines 1004 provide data to the data-in buffer 1021. The sense amplifier 1020 receives data from the data-in buffer 1021 and stores the data in the memory array 1010 as a charge on a capacitor of a cell at an address specified on the address lines 1002.

During a read operation, the DRAM 1000 transfers data to microprocessor 106 from the memory array 1010. Complementary bitlines for the accessed cell are equilibrated during a precharge operation to a reference voltage provided by an equilibration circuit and a reference voltage supply. The charge stored in the accessed cell is then shared with the associated bitlines. A sense amplifier of the sense amplifiers 1020 detects and amplifies a difference in voltage between the complementary bitlines. The sense amplifier passes the amplified voltage to. the data-out buffer 1024.

The control logic 1006 is used to control the many available functions of the DRAM 1000. In addition, various control circuits and signals not detailed herein initiate and synchronize the DRAM 1000 operation as known to those skilled in the art. As stated above, the description of DRAM 1000 has been simplified for purposes of illustrating the present invention and is not intended to be a complete description of all the features of a DRAM.

Bitlines $BL_1$–$BL_n$ are used to write to and read data from the memory cells within the memory array 1010. The wordlines $WL_1$–$WL_n$, are used to access a particular row of the memory cells that is to be written or read. The row decoder 1014 and the column decoder 1018 selectably access the memory cells in response to address signals that are provided on the address lines 1002 from the microprocessor 106 during write and read operations.

In operation, the DRAM memory 1000 receives an address of a particular memory cell at the address buffers 1012 and 1016. For example, the microprocessor 106 may provide the address buffers 1012 and 1016 with the address for a particular cell within the memory array 1010. The row address buffer 1012 identifies wordline $WL_1$, for example, for the appropriate memory cell to the row decoder 1014. The row decoder 1014 selectively activates the wordline $WL_1$ to activate a vertical access transistor of each memory cell connected to the wordline $WL_1$. The column address buffer 1016 identifies bitline $BL_1$, for example, for the appropriate memory cell to the column decoder 1018. The column decoder 1018 selectively activates the bitline $BL_1$ to activate a vertical access transistor of each memory cell connected to the bitline $BL_1$.

Figure 11:
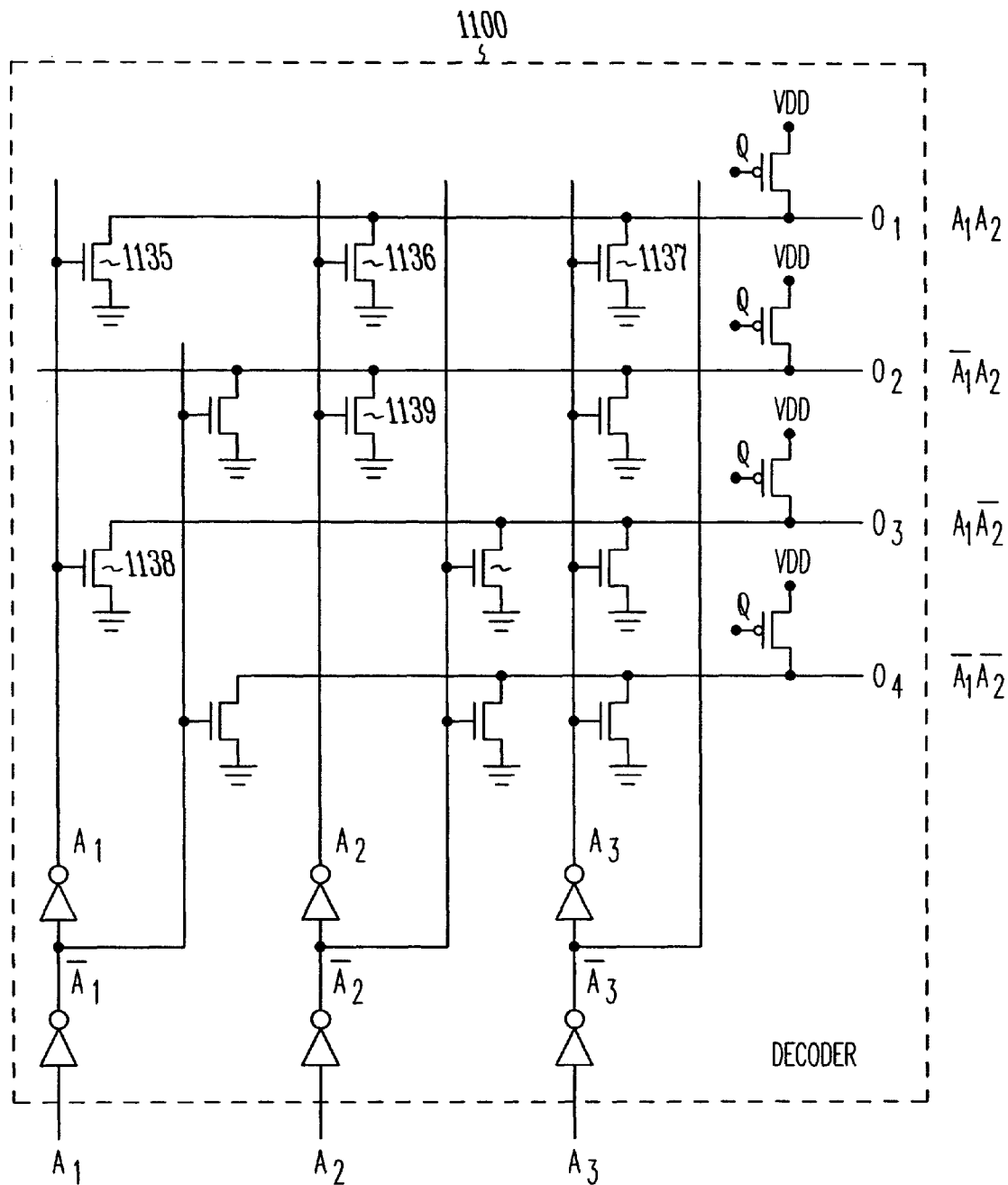
FIG. 11 is a schematic diagram illustrating generally an architecture of one embodiment of a programmable decoder according to the teachings of the present invention.

FIG. 11 is a schematic diagram that illustrates one embodiment of a decoder, indicated generally at 1100, that is constructed according to the teachings of the present invention. Decoder 1100 can be used, for example, as a memory address decoder such as column decoder 1018 or row decoder 1014 of FIG. 10.

Decoder 1100 of FIG. 11 includes a number of ultra thin single crystalline vertical transistors that are formed at the intersection of output lines $O_1$, through $O_4$ with either an address line $A_1$ through $A_3$ or inverse address line $\overline{A}_1$ through $\overline{A}_3$. The inverse address lines are coupled to associated address lines through an inverter as shown. For example, transistor 1135 is located at the intersection of address line $A_1$ and output line $O_1$.

Decoder 1100 is programmed using a mask programming technique. That is, vertical transistors are formed at each intersection of an output line with either an address line or an inverse address line. However, not all of the ultra thin single crystalline vertical transistors are operatively coupled to the address lines, inverse address lines or the output lines. Rather, ultra thin single crystalline vertical transistors are selectively connected into the array in order to implement a desired logical function. Thus, once the array is fabricated, the logical function cannot be changed.

In this embodiment, each of the output lines implements a NOR logic function for the address lines and inverse address lines that are connected to it through the ultra thin single crystalline vertical transistors. For example, output line $O_1$ is coupled to the drains of transistors 1135, 1136, and 1137. Transistors 1135, 1136, and 1137 have gates that are coupled to receive signals from address lines $A_1$, $A_2$, and $A_3$, respectively. Output line $O_1$ produces the logical NOR of the logic values provided on address lines $A_1$, $A_2$, and $A_3$. Output line $O_1$ produces a low logic level when any one of the address lines $A_1$, $A_2$, and $A_3$ is brought to a high logic level. Further, output line $O_1$ produces a high logic level only when the address lines $A_1$, $A_2$, and $A_3$ are all at a low logic level at the same time.

The remaining output lines are selectively coupled to other transistors as shown to implement additional NOR functions. These NOR functions are chosen such that the input address lines (and inverse address lines) can be used to selectively address the output lines. It is noted that the logical functions implemented in decoder 1100 are shown by way of illustration and not by way of limitation. Other logical functions can be implemented without departing from the spirit and scope of the present invention.

Generally speaking, decoder 1100 can be fabricated with N address input lines to uniquely select $2^N$ output lines. For example, in this case, two address lines, $A_1$ and $A_2$, are used to selectively access four output lines. Utilization of the address line $A_3$ for instance can be used to address eight output lines.

Figure 12A:
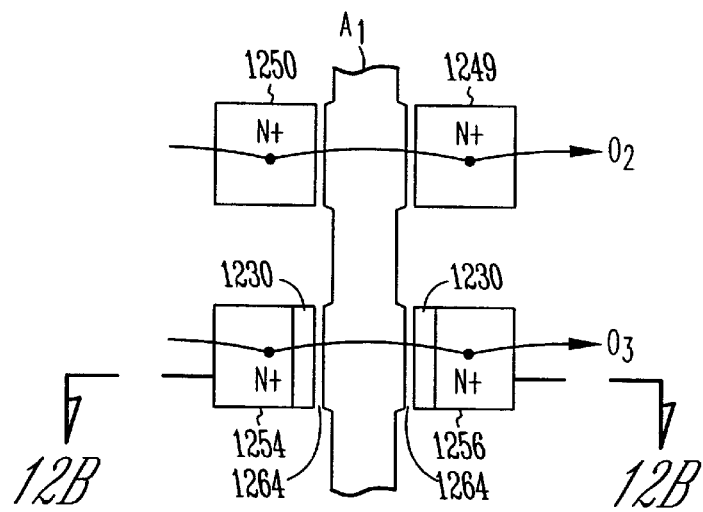
FIGS. 12A and 12B are top and front views of a portion of an embodiment of decoder of FIG. 11 showing horizontal replacement gates and ultra thin single crystalline vertical transistors along some sides of the pillars described above.
Figure 12B:
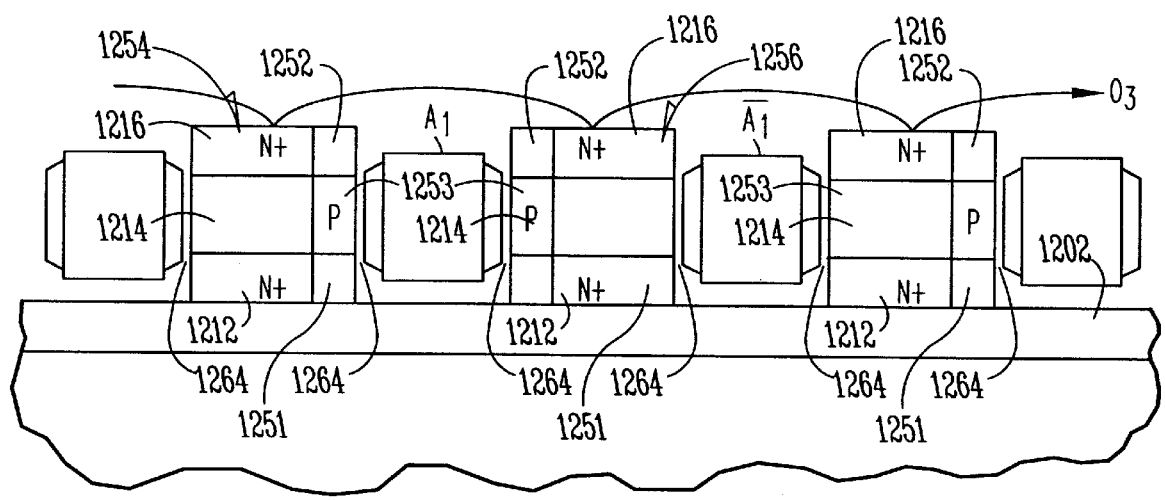

FIGS. 12A and 12B are top and front views of a portion of an embodiment of decoder 1100 of FIG. 11 showing horizontal replacement gates, as the same has been described herein, and ultra thin single crystalline vertical transistors along some sides of the pillars described above. In this embodiment, each of the address lines, $A_1$, $A_2$, and $A_3$ and inverse address lines $\overline{A}_1$, $\overline{A}_2$ and $\overline{A}_3$ is formed in a trench that separates rows of ultra thin single crystalline vertical transistors. For example, FIGS. 12A and 12B illustrate that address line A, is housed in a trench that separates pillars 1250 and 1254, from pillars 1249 and 1256. The electrical operation of the memory address NOR decode circuit 1100 will be understood by one of ordinary skill in the art in viewing these figures. FIG. 12A illustrates that there may or may not be an ultra thin single crystalline vertical transistor 1230 on a particular side of the pillars and likewise there may or may not be an ultra thin single crystalline vertical transistor 1230 on the other side of the pillar. If there is not an ultrathin body transistor then the gate address line A1 just bypasses the pillar. Transistors can be formed both on the front and back of the pillars, in this case the back gate can be or can not be biased at the same time as the front polysilicon gate is biased. Note that in this case the back gate line is equivalent to the front gate in that it has the same structure as the gate for the transistor on the front of the pillar. There is thus no physical distinction between the front gate and the back gate. In this particular embodiment, the ultra thin singal crystalline vertical body region of the ultra thin single crystalline vertical transistor is floating and fully depleted. The channels of the vertical devices are formed in the ultra thin single crystalline vertical transistor as described above. Address lines which gate the ultra thin single crystalline vertical transistors are formed by CVD deposition of either metal or poly silicon as described above. Contacts to the top-side metal address word lines used in the memory array can be made by using the conventional methods of contact hole etching.

The decoded addresses on the metal lines will be used to drive word lines in memory arrays to select particular rows in these memory arrays, whether they be DRAM, SRAM, EEPROM, PROM or flash. Contacts and wiring at the metal level can be achieved using conventional techniques.

In the embodiment shown in FIG. 12A, address line $A_1$, passes between pillars 1254 and 1256. Address line $A_1$ is separated from the ultra thin single crystalline vertical body region of the ultra thin single crystalline vertical transistor along side of pillar 1254 by gate insulator 1264.

FIG. 12B shows a cross sectional view taken along cut line 12B in FIG. 12A. As described above, the ultra thin single crystalline vertical second source/drain region is coupled to a second contact layer 1216 in pillar 1254. The second contact layer 1216 is coupled to output line $O_3$. The output line $O_3$ is similarly coupled to the second contact layer 1216 column adjacent pillars, e.g. 1256. In this manner, pillars 1254 and 1256 combine to provide the function of decoder 1100 in FIG. 11. When a high logic level is applied to address line $A_1$, inversion layers are formed within the ultra thin singal crystalline vertical body regions, e.g. 1253, of pillars 1254 and 1256 such that the pillars operate as metaloxide-semiconductor field-effect transistors (MOSFET). By turning on these transistors, the output line $O_3$ is brought to ground potential. Otherwise, when address line $A_1$ is grounded, the transistors are off and the output line $O_3$ is allowed to maintain a high logic level, unaffected by the transistors.

As mentioned above, in the embodiment of FIGS. 12A and 12B not all of the pillars of decoder 1100 have an ultra thin single crystalline vertical transistor along side of the pillar which are coupled with either an address line $A_1$, through $A_3$ or inverse address line $\overline{A}_1$, through $\overline{A}_3$. Some of the pillars are selectively left unused so as to implement a desired logical function. For example, pillars 1250 and 1249 are located at the intersection of address line $A_1$ and output line $O_2$. As shown in FIG. 12A, no transistor is required at this intersection in this embodiment. Thus, address line $A_1$ is a passing line between pillars 1250 and 1252.

In this embodiment, two pillars are used for each transistor in decoder 1100. Advantageously, this provides for redundancy in the performance of the logical function. If one of the pillars is defective or does not operate properly, the other pillar can continue to perform the logical operation. The cost of this redundancy is a decrease in circuit density because of the use of two pillars to perform the function of a single transistor.

Figure 13A:
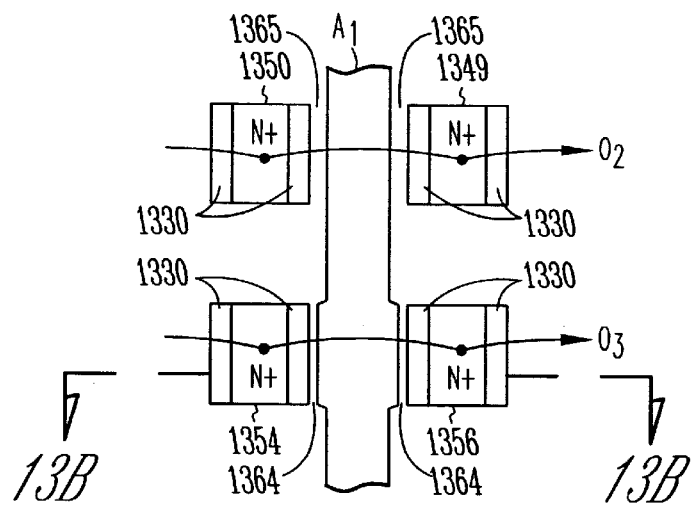
FIGS. 13A and 13B are top and front views of a portion of an embodiment of decoder of FIG. 11 showing horizontal replacement gates and ultra thin single crystalline vertical transistors along both sides of each pillar described above.
Figure 13B:
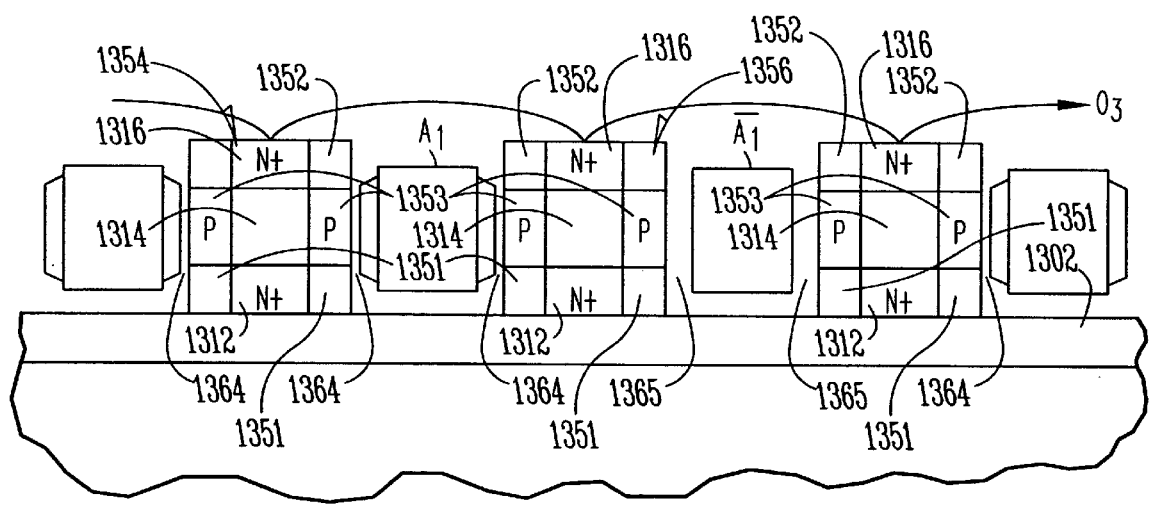

FIGS. 13A and 13B are top and front views of a portion of an embodiment of decoder 1100 of FIG. 11 showing horizontal replacement gates, as the same has been described herein, and ultra thin single crystalline vertical transistors along both sides of each pillar described above. In this embodiment, each of the address lines, $A_1$, $A_2$, and $A_3$ and inverse address lines $\overline{A}_1$, $\overline{A}_2$ and $\overline{A}_3$ is formed in a trench that separates rows of ultra thin single crystalline vertical transistors. For example, FIGS. 13A and 13B illustrate that address line $A_1$ is housed in a trench that separates pillars 1350 and 1354, from pillars 1349 and 1356. The electrical operation of the memory address NOR decode circuit 1100 will be understood by one of ordinary skill in the art in viewing these figures. FIG. 13A illustrates that there may or may not be an ultra thin gate oxide 1364 separating the single crystalline vertical transistor 1330 on a particular side of the pillars and likewise there may or may not be an ultra thin gate oxide 1364 separating the single crystalline vertical transistor 1330 on the other side of the pillar. If there is not an ultra thin gate oxide 1364 then the gate address line A1 just bypasses the pillar. As shown in FIGS. 13A and 13B, address line $A_1$ is a passing line between pillars 1350 and 1349 with sufficient spacing, e.g. a thick oxide 1365 as described in connection with FIGS. 7, from the pillars such that an inversion layer does not form in either pillar when a high voltage is applied to address line $A_1$. That is, the insulator, or thick oxide layer 1365 that separates pillars 1350 and 1349 from address line $A_1$ creates a transistor with a threshold voltage that is sufficiently high so as to exceed the most positive gate voltage to be applied in decoder 1100 such that the transistor will never turn on. FIG. 13B shows a cross sectional view taken along cut line 13B in FIG. 13A. As described above, the ultra thin single crystalline vertical second source/drain region 1352 is coupled to a second contact layer 1316 in pillar 1354. The second contact layer 1316 is coupled to output line $O_3$. The output line $O_3$ is similarly coupled to the second contact layer 1316 column adjacent pillars, e.g. 1356. In this manner, pillars 1354 and 1356 combine to provide the function of decoder 1100 in FIG. 11. When a high logic level is applied to address line $A_1$, inversion layers are formed within the ultra thin singal crystalline vertical body regions, e.g. 1353, of pillars 1354 and 1356 such that the pillars operate as metaloxide-semiconductor field-effect transistors (MOSFET). By turning on these transistors, the output line $O_3$ is brought to ground potential. Otherwise, when address line $A_1$ is grounded, the transistors are off and the output line $O_3$ is allowed to maintain a high logic level, unaffected by the transistors.

Figure 14A:
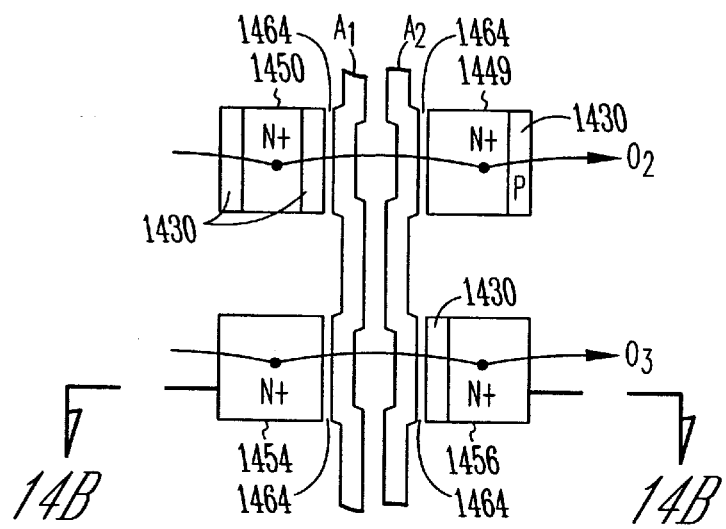
FIGS. 14A–14C are top and front views of a portion of an embodiment of decoder of FIG. 11 showing a vertical split gate/address line configuration and ultra thin single crystalline vertical transistors along some sides of the pillars described above.
Figure 14B:
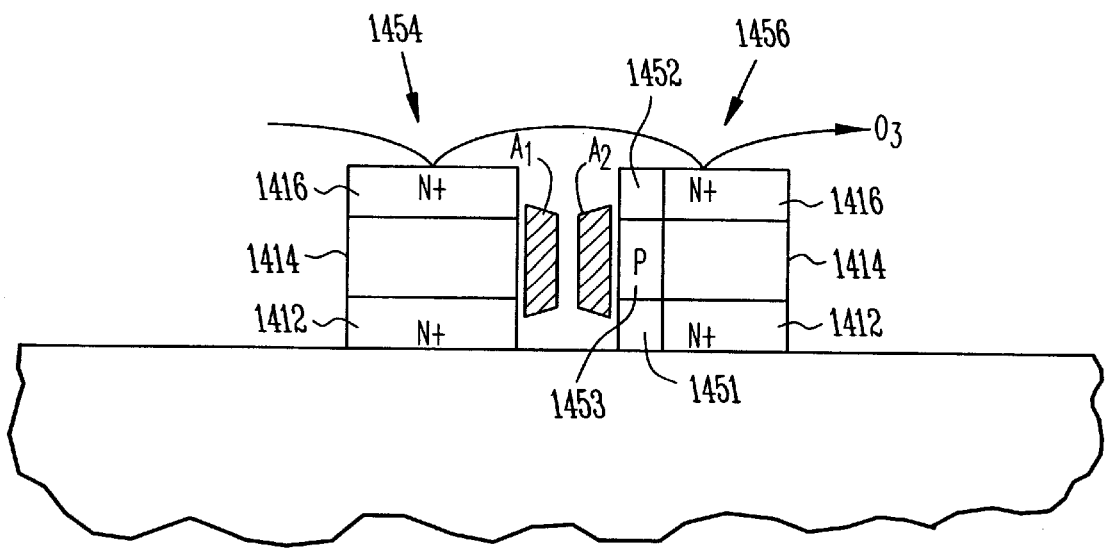

FIGS. 14A and 14B are top and front views of a portion of an embodiment of decoder 1100 of FIG. 11 showing a vertical split gate/address line configuration, as the same has been described herein, and ultra thin single crystalline vertical transistors along some sides of the pillars described above. In this embodiment, each of the address lines, $A_1$, $A_2$, and $A_3$ and inverse address lines $\overline{A}_1$, $\overline{A}_2$ and $\overline{A}_3$ is formed in a trench that separates rows of ultra thin single crystalline vertical transistors. For example, FIGS. 14A and 14B illustrate that address lines $A_1$ and $A_2$ are housed in a trench that separates pillars 1450 and 1454, from pillars 1449 and 1456. The electrical operation of this embodiment of the memory address NOR decode circuit 1100 will be understood by one of ordinary skill in the art in viewing these figures. FIG. 14A illustrates that there may or may not be an ultra thin single crystalline vertical transistor 1430 on a particular side of the pillars and likewise there may or may not be an ultra thin single crystalline vertical transistor 1430 on the other side of the pillar. If there is not an ultrathin body transistor then the gate address lines $A_1$ and $A_2$ just bypasses the pillar. Transistors can be formed both on the front and back of the pillars, in this case the back gate can be or can not be biased at the same time as the front polysilicon gate is biased. Note that in this case the back gate line is equivalent to the front gate in that it has the same structure as the gate for the transistor on the front of the pillar. There is thus no physical distinction between the front gate and the back gate. In this particular embodiment, the ultra thin singal crystalline vertical body region of the ultra thin single crystalline vertical transistor is floating and fully depleted. The channels of the vertical devices are formed in the ultra thin single crystalline vertical transistor as described above. Address lines $A_1$ and $A_2$ which gate the ultra thin single crystalline vertical transistors are formed by CVD deposition of either metal or poly silicon as described above. Contacts to the top-side metal address word lines used in the memory array can be made by using the conventional methods of contact hole etching.

The decoded addresses on the metal lines will be used to drive word lines in memory arrays to select particular rows in these memory arrays, whether they be DRAM, SRAM, EEPROM, PROM or flash. Contacts and wiring at the metal level can be achieved using conventional techniques.

In the embodiment shown in FIG. 14A, address lines $A_1$ and $A_2$ pass between pillars 1454 and 1456. Address lines $A_1$ and $A_2$ are separated from the ultra thin singal crystalline vertical body region of the ultra thin single crystalline vertical transistor by a thin gate oxide 1464, where the same are present along the pillars, e.g. along side of pillar 1464.

FIG. 14B shows a cross sectional view taken along cut line 14B in FIG. 14A. As described above, the ultra thin single crystalline vertical second source/drain 1452 region is coupled to a second contact layer 1416 in pillar 1454. The second contact layer 1416 is coupled to output line $O_3$. The output line $O_3$ is similarly coupled to the second contact layer 1416 column adjacent pillars, e.g. 1456. In this manner, pillars 1454 and 1456 combine to provide the function of decoder 1100 in FIG. 11. When a high logic level is applied to address lines $A_1$ and $A_2$, inversion layers are formed within the ultra thin singal crystalline vertical body regions, e.g. 1453, of pillar 1456 such that the pillar operates as a metal-oxide-semiconductor field-effect transistors (MOSFET). By turning on these transistors, the output line $O_3$ is brought to ground potential. Otherwise, when address line $A_1$ and $A_2$ are grounded, the transistors are off and the output line $O_3$ is allowed to maintain a high logic level, unaffected by the transistors.

As mentioned above, in the embodiment of FIGS. 14A and 14B not all of the pillars of decoder 1100 have an ultra thin single crystalline vertical transistor along side of the pillar which are coupled with either an address line $A_1$ through $A_3$ or inverse address line $\overline{A}_1$ through $\overline{A}_3$. Some of the pillars are selectively left unused so as to implement a desired logical function. For example, pillar 1450 does have an ultra thin single crystalline vertical transistor along side of the pillar at the intersection of address line $A_1$ and output line $O_2$. Pillar 1449 does not have an ultra thin single crystalline vertical transistor along side of the pillar at the intersection of address line $A_2$ and output line $O_2$. As shown in FIG. 14A, no transistor is required at this intersection in this embodiment. Thus, address line $A_2$ is a passing line for pillars 1449.

Figure 14C:
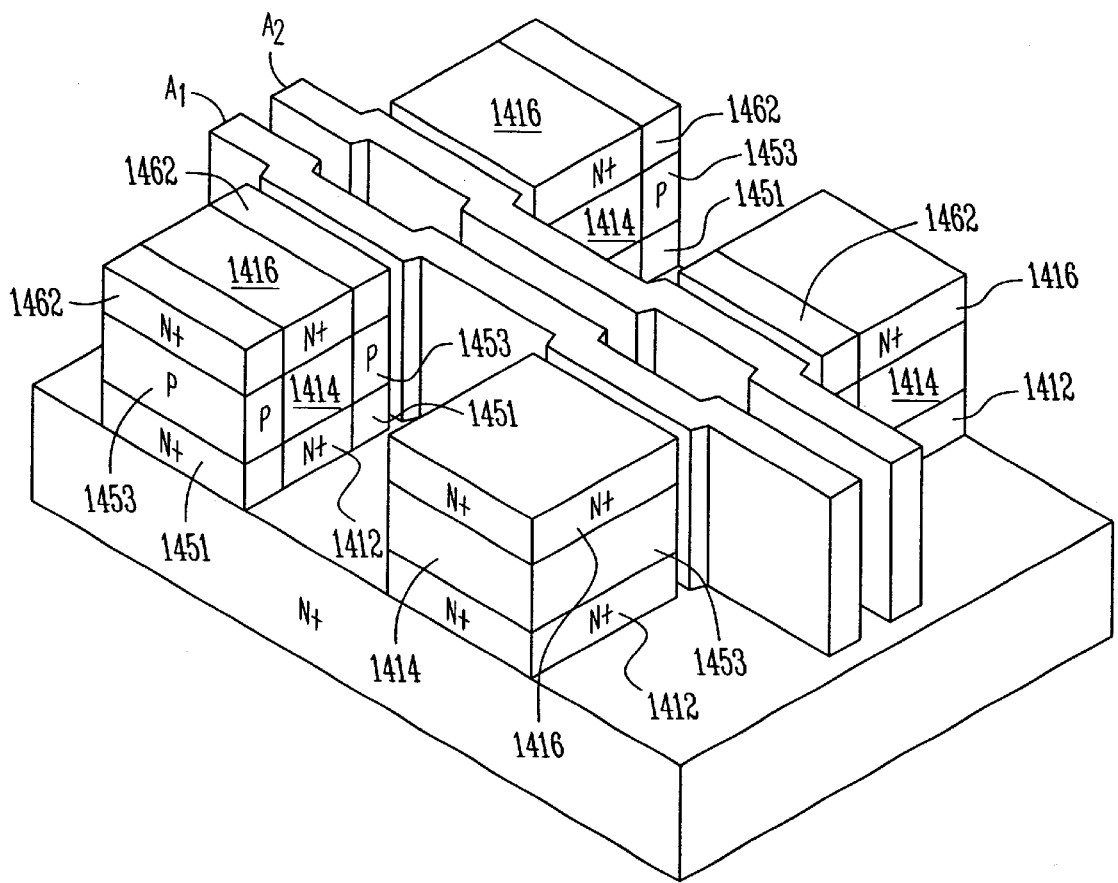

FIG. 14C is a perspective view of this embodiment. In the split gate configuration a much higher density of the decode 1100 is achieved. The embodiment using split or separate word lines is also shown in connection with FIGS. 7. These embodiments offer the benefit of substantially reducing the area associated with each device. Here the ultra thin single crystalline vertical transistors in a column in the decoder 1100 have a single gate/address lines, $A_1$, $A_2$, and $A_3$ and inverse address lines $\overline{A}_1$, $\overline{A}_2$ and $\overline{A}_3$ address for each address voltage. None of these address voltages on address lines, $A_1$, $A_2$, and $A_3$ and inverse address lines $\overline{A}_1$, $\overline{A}_2$ and $\overline{A}_3$ appear as gate potentials for the ultra thin single crystalline vertical transistors in column adjacent pillars. The address lines can be split by performing a directional etch following deposition to leave the conductor on the vertical sidewalls only, as was explained in more detail in connection with FIGS. 7.

Details of the fabrication can utilize the general techniques which we have described above in the fabrication of transfer devices in DRAM cells in either bulk or SOI technology. As one of ordinary skill in the art will understand upon reading this disclosure, the split or separate or gate/address lines, $A_1$, $A_2$, and $A_3$ and inverse address lines $\overline{A}_1$, $\overline{A}_2$ and $\overline{A}_3$ scheme will be similar to the open bit line address scheme in DRAMs where the address lines are split. The pillars are always gated on both sides, the logic is programmed into the array by determining whether or not there is an ultra thin single crystalline vertical transistor on the side of the pillar adjacent to the address lines, $A_1$, $A_2$, and $A_3$ and inverse address lines $\overline{A}_1$, $\overline{A}_2$ and $\overline{A}_3$ in order to form a transistor 1430.

Figure 15A:
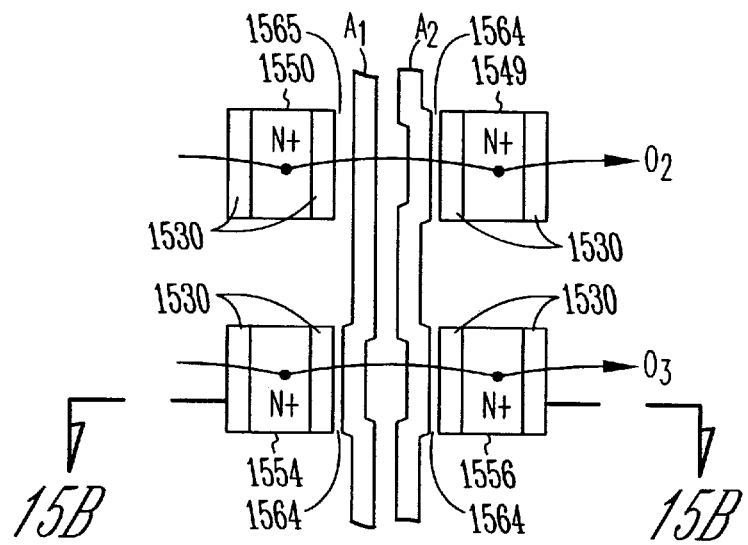
FIGS. 15A–15C are top and front views of a portion of an embodiment of decoder of FIG. 11 showing vertical gates and ultra thin single crystalline vertical transistors along both sides of each pillar described above.
Figure 15B:
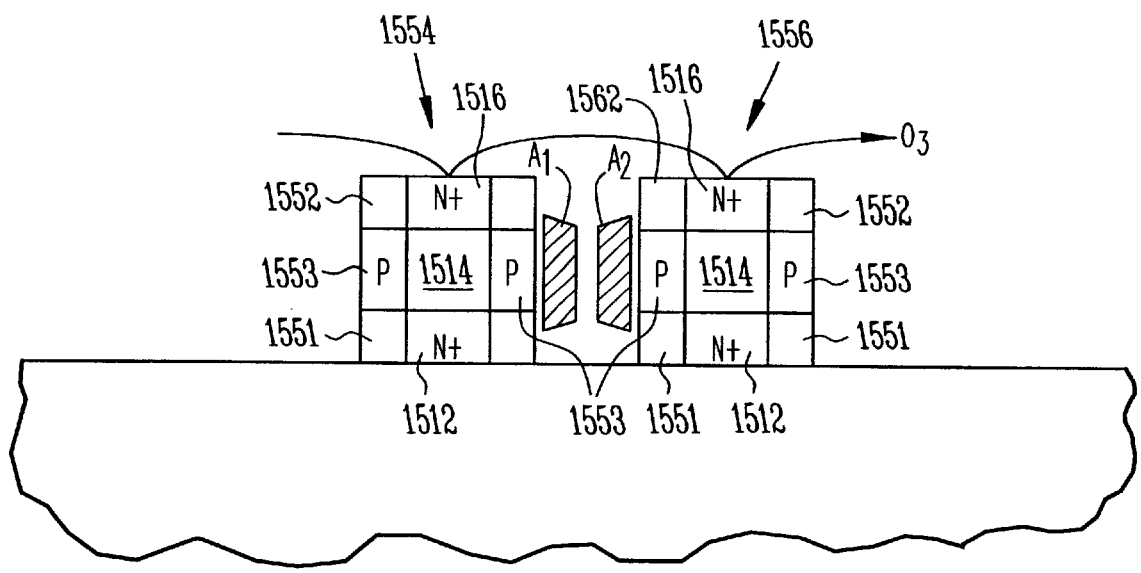

FIGS. 15A and 15B are top and front views of a portion of an embodiment of decoder 1100 of FIG. 11 showing vertical gates, as the same has been described herein, and ultra thin single crystalline vertical transistors along both sides of each pillar described above. In this embodiment, each of the address lines, $A_1$, $A_2$, and $A_3$ and inverse address lines $\overline{A}_1$, $\overline{A}_2$ and $\overline{A}_3$ is formed in a trench that separates rows of ultra thin single crystalline vertical transistors. For example, FIGS. 15A and 15B illustrate that address lines $\overline{A}_1$ and $A_2$ are housed in a trench that separates pillars 1550 and 1554, from pillars 1549 and 1556. The electrical operation of the memory address NOR decode circuit 1100 will be understood by one of ordinary skill in the art in viewing these figures. FIG. 15A illustrates that there may or may not be an ultra thin gate oxide 1564 separating the single crystalline vertical transistor 1530 on a particular side of the pillars and likewise there may or may not be an ultra thin gate oxide 1564 separating the single crystalline vertical transistor 1530 on the other side of the pillar. If there is not an ultra thin gate oxide 1564 then the gate address lines just bypasses the pillar. As shown in FIGS. 15A and 15B, address line $A_1$ is a passing line for pillar 1550 with sufficient spacing, e.g. a thick oxide 1565 as described in connection with FIGS. 7, from the pillar 1550 such that an inversion layer does not form in this pillar when a high voltage is applied to address line $A_1$. That is, the insulator, or thick oxide layer 1565 that separates pillar 1550 from address line $A_1$ creates a transistor with a threshold voltage that is sufficiently high so as to exceed the most positive gate voltage to be applied in decoder 1100 such that the transistor will never turn on.

FIG. 15B shows a cross sectional view taken along cut line 15B in FIG. 15A. As described above, the ultra thin single crystalline vertical second source/drain region 1552 is coupled to a second contact layer 1516 in pillar 1554. The second contact layer 1516 is coupled to output line $O_3$. The output line $O_3$ is similarly coupled to the second contact layer 1516 column adjacent pillars, e.g. 1556. In this manner, pillars 1554 and 1556 combine to provide the function of decoder 1100 in FIG. 11. When a high logic level is applied to address lines $A_1$ and $A_2$, inversion layers are formed within the ultra thin singal crystalline vertical body regions, e.g. 1553, of pillars 1554 and 1556 such that the ultra thin single crystalline vertical transistors in these pillars operate as metal-oxide-semiconductor field-effect transistors (MOSFET). By turning on these ultra thin single crystalline vertical transistors, the output line $O_3$ is brought to ground potential. Otherwise, when address lines $A_1$ and $A_2$ are grounded, the ultra thin single crystalline vertical transistors are off and the output line $O_3$ is allowed to maintain a high logic level, unaffected by the transistors.

Figure 15C:
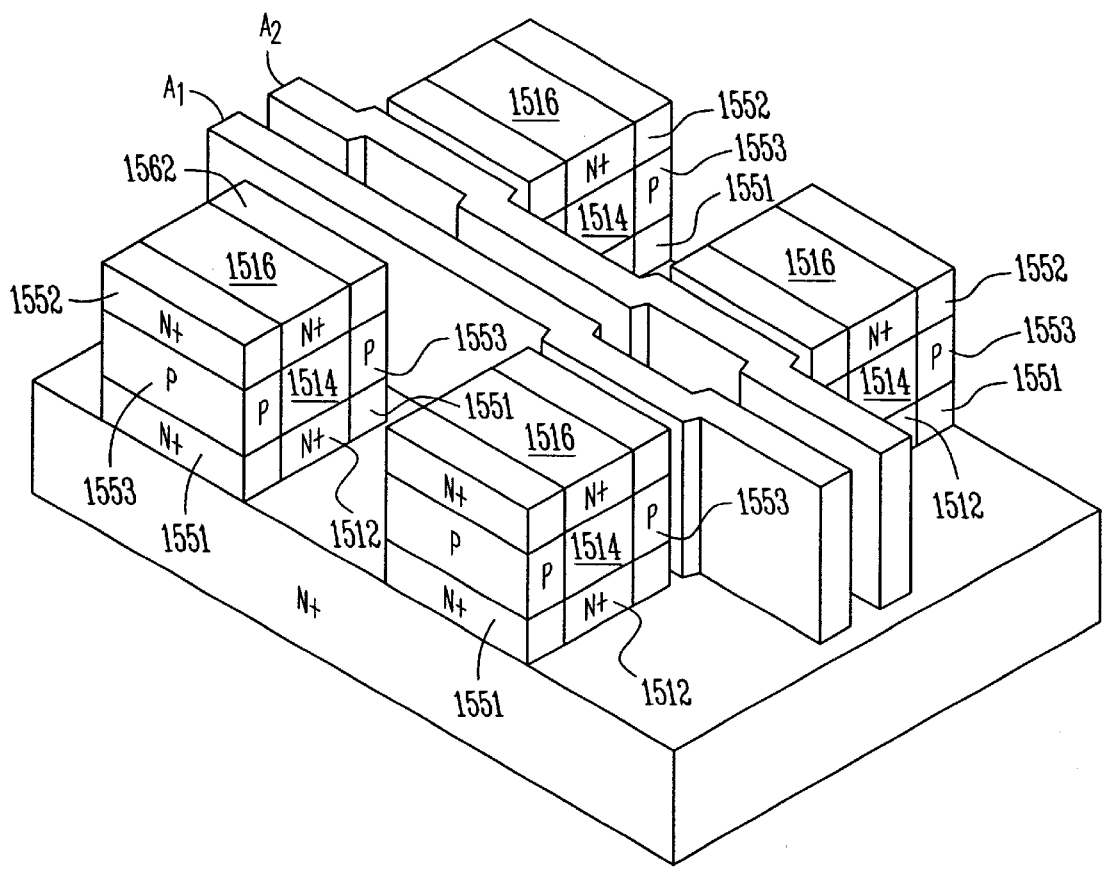

FIG. 15C is a perspective view of this embodiment. In the split gate configuration a much higher density of the decode 1100 is achieved. The embodiment using split or separate word lines is also shown in connection with FIGS. 7. These embodiments offer the benefit of substantially reducing the area associated with each device. Here the ultra thin single crystalline vertical transistors in a column in the decoder 1100 have a single gate/address lines, $A_1$, $A_2$, and $A_3$ and inverse address lines $\overline{A}_1$, $\overline{A}_2$ and $\overline{A}_3$ address for each address voltage. None of these address voltages on address lines, $A_1$, $A_2$, and $A_3$ and inverse address lines $\overline{A}_1$, $\overline{A}_2$ and $\overline{A}_3$ appear as gate potentials for the ultra thin single crystalline vertical transistors in column adjacent pillars. The address lines can be split by performing a directional etch following deposition to leave the conductor on the vertical sidewalls only, as was explained in more detail in connection with FIGS. 7. Details of the fabrication are similar to the techniques described above in the fabrication of transfer devices in DRAM cells in either bulk or SOI technology, except here now additional process steps, as explained in connection with FIGS. 7 are incorporated to allow the gate/address lines to bypass some pillars without activating the ultra thin single crystalline vertical transistors 1530 thereby. Again, this embodiment is referred to as the split address line embodiment because two lines are placed between rows of pillars. The advantage of the split address line embodiment is that the function of each transistor in decoder 1100 is implemented in a single pillar. This produces a significant increase in the density of decoder 1100.

Conclusion

Embodiments of the present invention provide a decoder with an increased density with respect to conventional decoder arrays. Specifically, ultra thin single crystalline vertical transistors are used at the intersection of output lines and address or inverse address lines. The ultra thin single crystalline vertical transistors are selectively coupled by mask programming to these lines so as to implement a desired logical function that allows the output lines to be selectively addressed. It is to be understood that the above description is intended to be illustrative, and not restrictive. Many other embodiments will be apparent to those of skill in the art upon reviewing the above description. For example, the logical function implemented by the decoder can be varied without departing from the scope of the present invention. Further, the number of address and inverse address lines can be similarly varied for a specific application. Thus, the scope of the invention is not limited to the particular embodiments shown and described herein.

What is claimed is:

1. A decoder for a memory device, comprising:
   a number of address lines;
   a number of output lines;
   wherein the address lines, and the output lines form an array; and
   a number of vertical pillars extending outwardly from a semiconductor substrate at intersections of output lines and address lines, wherein each pillar includes a single crystalline first contact layer and a second contact layer separated by an oxide layer;
   a number of single crystalline ultra thin vertical transistor that are selectively disposed adjacent the number of vertical pillars, wherein each single crystalline vertical transistor includes;
      an ultra thin single crystalline vertical first source/drain region coupled to the first contact layer;
      an ultra thin single crystalline vertical second source/drain region coupled to the second contact layer; and
      an ultra thin single crystalline vertical body region which opposes the oxide layer and couples the first and the second source/drain regions;
   a plurality of buried source lines formed of single crystalline semiconductor material and disposed below the pillars in the array for interconnecting with the first contact layer of pillars in the array; and wherein each of the number of address lines is disposed in a trench between rows of the pillars for addressing the ultra thin single crystalline vertical body regions of the single crystalline vertical transistors that are adjacent to the trench.

2. The decoder of claim 1, wherein the number of address lines includes a number of complementary address lines that are disposed in the array with a number of single crystalline ultra thin vertical transistor selectively disposed along side of pillars at intersections of the complementary address lines with the output lines.

3. The decoder of claim 1, wherein the number of single crystalline ultra thin vertical transistor are each formed on one side of the number of vertical pillars with one of the address lines forming a gate adjacent to the ultra thin single crystalline vertical body region along a row of pillars, and an output line coupled to the second contact layer along a column of pillars.

4. The decoder of claim 1, wherein two address lines are formed in each trench.

5. The decoder of claim 1, wherein the ultra thin single crystalline vertical transistors are each formed adjacent the same trench in a column adjacent pair pillars with an address line passing between the column adjacent pair of pillars, the address line forming gates adjacent to the ultra thin single crystalline vertical body regions in the pair, and an output line coupled to the second contact layer in the column adjacent pair of pillars.

6. The decoder of claim 1, wherein the ultra thin single crystalline vertical transistors are each formed adjacent the same trench in alternating row adjacent pillars with an address line forming gates adjacent to the ultra thin single crystalline vertical body regions in the alternating row adjacent pillars, and wherein the alternating row adjacent pillars are coupled to different output lines.

7. The decoder of claim 1, wherein the semiconductor substrate includes a silicon on insulator substrate.

8. A decoder for a memory device, comprising:
   a number of address lines;
   a number of output lines;
   wherein the address lines, and the output lines form an array;
   a number of vertical pillars extending outwardly from a semiconductor substrate at intersections of output lines and address lines, wherein each pillar includes a single crystalline first contact layer and a second contact layer separated by an oxide layer;
   a number of single crystalline ultra thin vertical transistor that are disposed adjacent the number of vertical pillars, wherein each single crystalline vertical transistor includes;
      an ultra thin single crystalline vertical first source/drain region coupled to the first contact layer;
      an ultra thin single crystalline vertical second source/drain region coupled to the second contact layer; and
      an ultra thin single crystalline vertical body region which opposes the oxide layer and couples the first and the second source/drain regions; and
      wherein a horizontal junction depth for the first and the second ultra thin single crystalline vertical source/drain regions is much less than a vertical length of the ultra thin single crystalline vertical body region;
   a plurality of buried source lines formed of single crystalline semiconductor material and disposed below the pillars in the array for interconnecting with the first contact layer of pillars in the array; and wherein each of the number of address lines is disposed in a trench between rows of the pillars for addressing the ultra thin single crystalline vertical body regions of the single crystalline vertical transistors that are adjacent to the trench.

9. The decoder of claim 8, wherein the ultra thin single crystalline vertical body region includes a channel having a vertical length of less than 100 nanometers.

10. The decoder of claim 8, wherein the ultra thin single crystalline vertical body region has a horizontal width of less than 10 nanometers.

11. The decoder of claim 8, wherein the ultra thin single crystalline vertical body region is formed from solid phase epitaxial growth.

12. The decoder of claim 8, wherein the plurality of buried source lines are more heavily doped than the first contact layer and are formed integrally with the first contact layer.

13. The decoder of claim 8, wherein the semiconductor substrate includes a silicon on insulator substrate.

14. A decode circuit for a semiconductor memory, comprising:
a number of address lines;
a number of output lines;
wherein the address lines, and the output lines form an array;
a number of vertical pillars extending outwardly from a semiconductor substrate at intersections of output lines and address lines, wherein each pillar includes a single crystalline first contact layer and a second contact layer separated by an oxide layer;
a pair of single crystalline ultra thin vertical transistors formed along opposing sides of each pillar, wherein each single crystalline vertical transistor includes;
an ultra thin single crystalline vertical first source/drain region coupled to the first contact layer;
an ultra thin single crystalline vertical second source/drain region coupled to the second contact layer; and
an ultra thin single crystalline vertical body region which opposes the oxide layer and couples the first and the second source/drain regions; and
wherein a surface space charge region for the single crystalline vertical transistor scales down as other dimensions of the transistor scale down;
a plurality of buried source lines formed of single crystalline semiconductor material and disposed below the pillars in the array for interconnecting with the first contact layer of pillars in the array; and
wherein each of the number of address lines is disposed in a trench between rows of the pillars for addressing the ultra thin single crystalline vertical body regions of the single crystalline vertical transistors that are adjacent to the trench.

15. The decode circuit of claim 14, wherein each address line integrally forms a gate for addressing the body region in a pillar on a first side of the trench and is isolated from the body region in a column adjacent pillar on a second side of the trench.

16. The decode circuit of claim 14, wherein each address line integrally forms a gate for addressing the body region in a pillar on the first side of the trench and is isolated from the body region is a row adjacent pillar on the first side of the trench.

17. The decode circuit of claim 14, wherein each ultra thin single crystalline vertical body region includes a p-type channel having a vertical length of less than 100 nanometers.

18. The decode circuit of claim 14, wherein the number of buried source lines are formed integrally with the first contact layer and are separated from the semiconductor substrate by an oxide layer.

19. The decode circuit of claim 14, wherein each address line includes a horizontally oriented address line having a vertical side length of less than 100 nanometers.

20. The decode circuit of claim 14, wherein each address line includes a vertically oriented address line having a vertical length of less than 100 nanometers.

21. A decode circuit for a semiconductor memory, comprising:
a number of address lines;
a number of output lines;
wherein the address lines, and the output lines form an array;
a number of vertical pillars extending outwardly from a semiconductor substrate at intersections of output lines and address lines, wherein each pillar includes a single crystalline first contact layer and a second contact layer separated by an oxide layer;
a number of single crystalline ultra thin vertical transistors formed along selected sides of each pillar, wherein each single crystalline vertical transistor includes;
an ultra thin single crystalline vertical first source/drain region coupled to the first contact layer;
an ultra thin single crystalline vertical second source/drain region coupled to the second contact layer;
an ultra thin single crystalline vertical body region which opposes the oxide layer and couples the first and the second source/drain regions; and
a gate opposing the vertical body region and separated therefrom by a gate oxide;
a plurality of buried source lines formed of single crystalline semiconductor material and disposed below the pillars in the array for interconnecting with the first contact layer of pillars in the array; and
a plurality of first address lines, each first address line disposed orthogonally to the plurality of buried bit lines in a trench between rows of the pillars for addressing gates of the single crystalline vertical transistors that are adjacent to a first side of the trench in selected pillars along the first side of the trench; and
a plurality of second address lines, each second address line disposed orthogonally to the bit lines in the trench between rows of the pillars and separated from each first address line by an insulator such that the second address line is adjacent a second side of the trench and addresses gates of the single crystalline vertical transistors that are adjacent to a second side of the trench in selected pillars along a second side of the trench.

22. The decode circuit of claim 21, wherein each gate adjacent to a first side of the trench along a row of pillars is integrally formed with one of the plurality of first address lines in the adjacent trench, and wherein each of the plurality of first address lines includes a vertically oriented address line having a vertical length of less than 100 nanometers.

23. The decode circuit of claim 21, wherein each gate adjacent to a second side of the trench along a row of pillars is integrally formed with one of the plurality of second address lines in the adjacent trench, and wherein each of the plurality of second address lines includes a horizontally oriented address line having a side with a vertical length of less than 100 nanometers.

24. The memory device of claim 21, wherein each single crystalline vertical transistor has a vertical length of less than 100 nanometers and a horizontal width of less than 10 nanometers.

25. The decode circuit of claim 21, wherein each of the plurality of second address lines includes a complementary address line.

26. A memory address decoder, comprising:
a number of address lines;
a number of output lines;
wherein the address lines, and the output lines form an array;
a number of vertical pillars extending outwardly from a semiconductor substrate at intersections of output lines and address lines, wherein each pillar includes a single crystalline first contact layer and a second contact layer separated by an oxide layer;
a pair of single crystalline ultra thin vertical transistors along opposing sides of each pillar, wherein each single crystalline vertical transistor includes;
an ultra thin single crystalline vertical first source/drain region coupled to the first contact layer;
an ultra thin single crystalline vertical second source/drain region coupled to the second contact layer; and
an ultra thin single crystalline vertical body region which opposes the oxide layer and couples the first and the second source/drain regions;
a plurality of buried source lines formed of single crystalline semiconductor material and disposed below the pillars in the array for interconnecting with the first contact layer of column adjacent pillars in the array; and
a plurality of first address lines, each first address line disposed orthogonally to the plurality of buried source lines in a trench between rows of the pillars for addressing body regions of the single crystalline vertical transistors in selected row adjacent pillars that are adjacent to a first side of the trench; and
a plurality of second address lines, each second address line disposed orthogonally to the source lines in the trench between rows of the pillars and separated from each first address line by an insulator such that the second address line is adjacent a second side of the trench and addresses body regions of the single crystalline vertical transistors in selected row adjacent pillars that are adjacent to a second side of the trench; and
wherein each of the number of output lines is coupled to the second contact layer of column adjacent pillars.

27. The memory address decoder of claim 26, wherein each of the plurality of first address lines integrally forms a gate for addressing the body region in a select number of row adjacent pillars on a first side of the trench and is isolated by an insulator layer from the body region for other ones of the row adjacent pillars on the first side of the trench.

28. The memory address decoder of claim 26, wherein each of the plurality of second address lines integrally forms a gate for addressing the body region in a select number of pillars on a second side of the trench and is isolated by an insulator layer from the body region for other ones of the row adjacent pillars on the second side of the trench.

29. The memory address decoder of claim 26, wherein each of the plurality of first and second address lines includes a vertically oriented address line having a vertical length of less than 100 nanometers.

30. The memory address decoder of claim 26, wherein each single crystalline vertical transistor has a vertical length of less than 100 nanometers and a horizontal width of less than 10 nanometers.

31. An address decode circuit, comprising:
a number of address lines;
a number of output lines that are selectively coupled to the address lines;
wherein the address lines and the output lines form an array; and
a number of single crystalline ultra thin vertical transistors that are selectively disposed at intersections of output lines and address lines, wherein each single crystalline vertical transistor includes;
an ultra thin single crystalline vertical first source/drain region;
an ultra thin single crystalline vertical second source/drain region; and
an ultra thin single crystalline vertical body region which couples the first and the second source/drain regions; and
wherein the number of address lines integrally form gates opposing the ultra thin single crystalline vertical body regions such that the single crystalline ultra thin vertical transistors implement a logic function that selects an output line responsive to an address provided to the address lines.

32. The address decode circuit of claim 31, wherein each of the address lines includes a vertically oriented address line having a vertical length of less than 100 nanometers.

33. The address decode circuit of claim 31, wherein each single crystalline vertical transistor has a vertical length of less than 100 nanometers and a horizontal width of less than 10 nanometers.

34. A memory device, comprising:
an array of wordlines and complementary bit line pairs;
a number of memory cells that are each addressably coupled at intersections of a word line with a bit line of a complementary bit line pair;
a row decoder that is coupled to the wordlines so as to implement a logic function that selects one of the wordlines responsive to an address provided to the row decoder on a number of address lines;
a number of sense amplifiers, each coupled to a complementary pair of bit lines;
a column decoder that is coupled to the sense amplifiers so as to implement a logic function that selects one of the complementary pairs of bit lines responsive to an address provided to the column decoder; and
wherein the row decoder comprises an array of single crystalline ultra thin vertical transistors that are selectively coupled to implement a logic function that selects a wordline based on a supplied address, wherein each single crystalline vertical transistor includes;
an ultra thin single crystalline vertical first source/drain region;
an ultra thin single crystalline vertical second source/drain region; and
an ultra thin single crystalline vertical body region which couples the first and the second source/drain regions.

35. The memory device of claim 34, wherein each of the address lines includes a vertically oriented address line having a vertical length of less than 100 nanometers.

36. The memory device of claim 34, wherein each single crystalline vertical transistor has a vertical length of less than 100 nanometers and a horizontal width of less than 10 nanometers.

37. The memory device of claim 34, wherein the column decoder includes an array of single crystalline ultra thin vertical transistors that are selectively coupled to implement a logic function that selects one of the complementary pairs of bit lines responsive to an address provided to the column decoder, wherein each single crystalline vertical transistor includes:
  an ultra thin single crystalline vertical first source/drain region;
  an ultra thin single crystalline vertical second source/drain region; and
  an ultra thin single crystalline vertical body region which couples the first and the second source/drain regions.

38. An electronic system, comprising:
  a processor; and
  a memory device coupled to processor, wherein the memory device includes a decoder the decoder comprising:
    a number of address lines;
    a number of output lines;
    wherein the address lines, and the output lines form an array;
    a number of vertical pillars extending outwardly from a semiconductor substrate at intersections of output lines and address lines, wherein each pillar includes a single crystalline first contact layer and a second contact layer separated by an oxide layer;
    a number of single crystalline ultra thin vertical transistor that are disposed adjacent the number of vertical pillars, wherein each single crystalline vertical transistor includes;
      an ultra thin single crystalline vertical first source/drain region coupled to the first contact layer;
      an ultra thin single crystalline vertical second source/drain region coupled to the second contact layer; and
      an ultra thin single crystalline vertical body region which opposes the oxide layer and couples the first and the second source/drain regions; and
    a plurality of buried source lines formed of single crystalline semiconductor material and disposed below the pillars in the array for interconnecting with the first contact layer of pillars in the array; and
    wherein each of the number of address lines is disposed in a trench between rows of the pillars for addressing the ultra thin single crystalline vertical body regions of the single crystalline vertical transistors that are adjacent to the trench.

39. The electronic system of claim 38, wherein the ultra thin single crystalline vertical body region includes a channel having a vertical length of less than 100 nanometers.

40. The electronic system of claim 38, wherein the ultra thin single crystalline vertical body region has a horizontal width of less than 10 nanometers.

41. The electronic system of claim 38, Wherein the ultra thin single crystalline vertical body region is formed from solid phase epitaxial growth.

42. The electronic system of claim 38, wherein the plurality of buried source lines are more heavily doped than the first contact layer and are formed integrally with the first contact layer.

43. The electronic system of claim 38, wherein the semiconductor substrate includes a silicon on insulator substrate.

44. An electronic system, comprising:
  a processor; and
  a memory device coupled to processor, wherein the memory device includes a memory address decoder, the memory address decoder comprising:
    a number of address lines;
    a number of output lines;
    wherein the address lines, and the output lines form an array;
    a number of vertical pillars extending outwardly from a semiconductor substrate at intersections of output lines and address lines, wherein each pillar includes a single crystalline first contact layer and a second contact layer separated by an oxide layer;
    a pair of single crystalline ultra thin vertical transistors along opposing sides of each pillar, wherein each single crystalline vertical transistor includes;
      an ultra thin single crystalline vertical first source/drain region coupled to the first contact layer;
      an ultra thin single crystalline vertical second source/drain region coupled to the second contact layer; and
      an ultra thin single crystalline vertical body region which opposes the oxide layer and couples the first and the second source/drain regions;
    a plurality of buried source lines formed of single crystalline semiconductor material and disposed below the pillars in the array for interconnecting with the first contact layer of column adjacent pillars in the array; and
    a plurality of first address lines, each first address line disposed orthogonally to the plurality of buried source lines in a trench between rows of the pillars for addressing body regions of the single crystalline vertical transistors in selected row adjacent pillars that are adjacent to a first side of the trench; and
    a plurality of second address lines, each second address line disposed orthogonally to the source lines in the trench between rows of the pillars and separated from each first address line by an insulator such that the second address line is adjacent a second side of the trench and addresses body regions of the single crystalline vertical transistors in selected row adjacent pillars that are adjacent to a second side of the trench; and
    wherein each of the number of output lines is coupled to the second contact layer of column adjacent pillars.

45. The electronic system of claim 44, wherein each of the plurality of first address lines integrally forms a gate for addressing the body region in a select number of row adjacent pillars on a first side of the trench and is isolated by an insulator layer from the body region for other ones of the row adjacent pillars on the first side of the trench.

46. The electronic system of claim 44, wherein each of the plurality of second address lines integrally forms a gate for addressing the body region in a select number of pillars on a second side of the trench and is isolated by an insulator layer from the body region for other ones of the row adjacent pillars on the second side of the trench.

47. The electronic system of claim 44, wherein each of the plurality of first and second address lines includes a vertically oriented address line having a vertical length of less than 100 nanometers.

48. The electronic system of claim 44, wherein each single crystalline vertical transistor has a vertical length of less than 100 nanometers and a horizontal width of less than 10 nanometers.

49. A computer system, comprising:
  a processor; and
  a memory device coupled to the processor, wherein the memory device includes:

an array of wordlines and complementary bit line pairs;

a number of memory cells that are each addressably coupled at intersections of a word line with a bit line of a complementary bit line pair;

a row decoder that is coupled to the wordlines so as to implement a logic function that selects one of the wordlines responsive to an address provided to the row decoder on a number of address lines;

a number of sense amplifiers, each coupled to a complementary pair of bit lines;

a column decoder that is coupled to the sense amplifiers so as to implement a logic function that selects one of the complementary pairs of bit lines responsive to an address provided to the column decoder; and wherein the row decoder comprises an array of single crystalline ultra thin vertical transistors that are selectively coupled to implement a logic function that selects a wordline based on a supplied address, wherein each single crystalline vertical transistor includes:

an ultra thin single crystalline vertical first source/drain region;

an ultra thin single crystalline vertical second source/drain region; and an ultra thin single crystalline vertical body region which couples the first and the second source/drain regions.

50. The computer system of claim 49, wherein each of the address lines includes a vertically oriented address line having a vertical length of less than 100 nanometers.

51. The computer system of claim 49, wherein each single crystalline vertical transistor has a vertical length of less than 100 nanometers and a horizontal width of less than 10 nanometers.

52. The computer system of claim 49, wherein the column decoder includes an array of single crystalline ultra thin vertical transistors that are selectively coupled to implement a logic function that selects one of the complementary pairs of bit lines responsive to an address provided to the column decoder, wherein each single crystalline vertical transistor includes:

an ultra thin single crystalline vertical first source/drain region;

an ultra thin single crystalline vertical second source/drain region; and an ultra thin single crystalline vertical body region which couples the first and the second source/drain regions.

* * * * *

UNITED STATES PATENT AND TRADEMARK OFFICE
CERTIFICATE OF CORRECTION

PATENT NO. : 6,448,601 B1
DATED : September 10, 2002
INVENTOR(S) : Forbes et al.

It is certified that error appears in the above-identified patent and that said Letters Patent is hereby corrected as shown below:

Title page,
Item [56], U.S. PATENT DOCUMENTS, delete "6,208,164 B1 * 3/2001 Forbes et al." and insert -- 6,208,164 B1 * 3/2001 Noble et al. --, therefor.

Column 2,
Line 31, delete "100 μm" and insert -- 100 nm --, therefor.

Column 13,
Line 24, delete "$WL_n$," and insert -- $WL_n$ --, therefor.
Line 54, delete "$O_1$ ," and insert -- $O_1$ --, therefor.

Column 15,
Line 6, delete "$A_1$," and insert -- $A_1$ --, therefor.
Line 33, delete "$A_1$," and insert -- $A_1$ --, therefor.
Line 34, delete "$\bar{A}_1$," and insert -- $\bar{A}_1$ --, therefor.

Column 16,
Line 27, delete "$O_3$is" and insert -- $O_3$ is --, therefor.

Column 25,
Line 53, delete "Wherein" and insert -- wherein --, therefor.

Signed and Sealed this

Twenty-fifth Day of February, 2003

JAMES E. ROGAN
*Director of the United States Patent and Trademark Office*